United States Patent
Ross et al.

(10) Patent No.: US 9,714,978 B2
(45) Date of Patent: Jul. 25, 2017

(54) AT-SPEED INTEGRATED CIRCUIT TESTING USING THROUGH SILICON IN-CIRCUIT LOGIC ANALYSIS

(71) Applicants: Larry Ross, Los Gatos, CA (US); Michael Bruce, Austin, TX (US)

(72) Inventors: Larry Ross, Los Gatos, CA (US); Michael Bruce, Austin, TX (US)

( * ) Notice: Subject to any disclaimer, the term of this patent is extended or adjusted under 35 U.S.C. 154(b) by 935 days.

(21) Appl. No.: 13/862,244

(22) Filed: Apr. 12, 2013

(65) Prior Publication Data
US 2014/0149811 A1 May 29, 2014

Related U.S. Application Data

(60) Provisional application No. 61/623,442, filed on Apr. 12, 2012.

(51) Int. Cl.
*G01R 31/3177* (2006.01)
*G01R 31/28* (2006.01)
*G01R 31/311* (2006.01)

(52) U.S. Cl.
CPC ........ *G01R 31/2882* (2013.01); *G01R 31/311* (2013.01)

(58) Field of Classification Search
None
See application file for complete search history.

(56) References Cited

U.S. PATENT DOCUMENTS

| | | | | |
|---|---|---|---|---|
| 5,095,262 A | * | 3/1992 | Henley | G01R 31/31922 324/73.1 |
| 5,157,327 A | * | 10/1992 | Henley | G01R 31/308 324/74 |
| 5,272,330 A | * | 12/1993 | Betzig | B82Y 20/00 250/216 |
| 5,288,997 A | * | 2/1994 | Betzig | B82Y 20/00 250/227.26 |
| 5,288,999 A | * | 2/1994 | Betzig | B82Y 20/00 250/227.26 |
| 5,391,985 A | * | 2/1995 | Henley | G01R 31/308 324/73.1 |
| 5,404,410 A | * | 4/1995 | Tojo | G06T 7/001 382/144 |
| 5,430,305 A | * | 7/1995 | Cole, Jr. | G01R 31/311 250/559.07 |

(Continued)

*Primary Examiner* — Jermele M Hollington
*Assistant Examiner* — Suresh K Rajaputra
(74) *Attorney, Agent, or Firm* — Ascenda Law Group, PC

(57) ABSTRACT

A method, system, and computer program product for integrated circuit wafer and die testing. The method commences by selecting areas of interest accessible from a backside of an integrated circuit where the areas of interest correspond to electronic devices (e.g., gates or transistors or vias or pads). Then, using a small-beam light source such as a laser, illuminating the areas of interest and collecting the reflected signal returned from illuminated areas of interest. A processor analyses the reflected signal to determine logic states and timing information of the electronic devices and compares the determined logic states and timing information to a pre-determined logic pattern to identify one or more errors as observed from the actual electronic devices. Specific points within an area of interest are determined from CAD layout data, and the pre-determined logic patterns can be retrieved from CAD simulation data.

28 Claims, 21 Drawing Sheets

(56) References Cited

U.S. PATENT DOCUMENTS

| | | | | |
|---|---|---|---|---|
| 5,570,011 A * | 10/1996 | Henley | | G01R 31/308 324/73.1 |
| 5,905,577 A * | 5/1999 | Wilsher | | G01R 31/311 324/754.23 |
| 6,501,288 B1 * | 12/2002 | Wilsher | | G01R 31/311 324/515 |
| 6,512,385 B1 * | 1/2003 | Pfaff | | G01R 15/241 324/754.23 |
| 6,621,275 B2 * | 9/2003 | Cotton | | G01R 31/311 324/537 |
| 6,810,344 B1 * | 10/2004 | Iwasa | | G11C 29/10 702/82 |
| 6,882,416 B1 * | 4/2005 | Hunter | | G01N 21/8851 356/237.4 |
| 7,152,007 B2 * | 12/2006 | Arnone | | G01N 21/3581 702/75 |
| 7,224,828 B2 * | 5/2007 | Cotton | | G01R 31/311 324/537 |
| 7,439,730 B2 * | 10/2008 | Desplats | | G01R 31/311 324/762.08 |
| 7,450,245 B2 * | 11/2008 | Woods | | G01R 31/308 356/369 |
| 7,466,852 B2 * | 12/2008 | Cotton | | G01R 31/311 324/501 |
| 7,478,345 B2 * | 1/2009 | Kasapi | | G01R 31/31937 716/136 |
| 7,616,312 B2 * | 11/2009 | Kasapi | | G01R 31/308 356/369 |
| 7,659,981 B2 * | 2/2010 | Lo | | G01R 31/307 356/369 |
| 8,273,610 B2 * | 9/2012 | Or-Bach | | G11C 8/16 257/E23.101 |
| 2003/0161411 A1 * | 8/2003 | McCorkle | | G01S 7/023 375/295 |
| 2005/0216877 A1 * | 9/2005 | Pack | | G03F 1/144 430/5 |
| 2005/0231733 A1 * | 10/2005 | Pfaff | | G01B 11/2441 356/517 |
| 2006/0076503 A1 * | 4/2006 | Tsao | | H01J 37/228 250/396 R |
| 2006/0244974 A1 * | 11/2006 | Pfaff | | G01B 11/2441 356/517 |
| 2008/0252898 A1 * | 10/2008 | Pfaff | | G01B 11/2441 356/457 |
| 2009/0150098 A1 * | 6/2009 | Khurana | | G01R 31/311 702/58 |
| 2010/0039131 A1 * | 2/2010 | Kasapi | | G01R 31/308 324/762.02 |
| 2010/0277159 A1 * | 11/2010 | Ng | | G01R 31/311 324/97 |
| 2012/0030532 A1 * | 2/2012 | Jain | | G01R 31/31854 714/726 |
| 2012/0086432 A1 * | 4/2012 | Noell | | G01R 31/303 324/96 |
| 2012/0127473 A1 * | 5/2012 | Pfaff | | G01B 11/2441 356/457 |
| 2013/0181722 A1 * | 7/2013 | Pfaff | | G01R 15/241 324/501 |
| 2014/0103935 A1 * | 4/2014 | Pfaff | | G01R 15/241 324/501 |

* cited by examiner

FIG. 5B

Example Report for Via5 Open Defect 902

```
OPEN_LOCATION_BEGIN
suspect layout category  critical_area  x_coord1  y_coord1  x_coord2  y_coord2
1.1      M5     OP        1.06E+04       6785840   4770500   6786880   4771340
1.1      M5     OP        7.63E+03       6785840   4779040   6786880   4781280
1.1      M5     OP        7.63E+03       6790880   4769100   6791920   4771340
1.1      M5     OP        1.12E+03       6786130   4770780   6791630   4771060
1.1      M5     OP        8.95E+01       6766430   4780020   6786500   4780300
1.1      VIA5   M6_VM5DBNS 9.92E+03      6786000   4780500   6786720   4781220
1.1      VIA5   M6_MV5DBS  9.92E+03      6791040   4770560   6791760   4771280
                                         6791040   4770560   6791760   4771280
OPEN_LOCATION_BEGIN
OPEN_LOCATION_BEGIN                                                    0140
OPEN_LOCATION_BEGIN
suspect layout category  critical_area  x_coord1  y_coord1  x_coord2  y_coord2
1.1      M5     OP        1.06E+04       6785840   4770500   6786880   4771340
1.1      M5     OP        7.63E+03       6785840   4779040   6786880   4781280
1.1      M5     OP        7.63E+03       6790880   4769100   6791920   4771340
1.1      M5     OP        1.12E+03       6786130   4770780   6791630   4771060
1.1      M5     OP        8.95E+01       6766430   4780020   6786500   4780300
1.1      VIA5   M6_VM5DBNS 9.92E+03      6786000   4780500   6786720   4781220
1.1      VIA5   M6_MV5DBS  9.92E+03      6791040   4770560   6791760   4771280
1.1      VIA5   M6_M5H     9.92E+03      6786000   4770560   6786720   4771280
1.1      M6     OP         1.38E+06      6785940   4770500   6786780   4770140
..........
OPEN_LOCATION_END
```

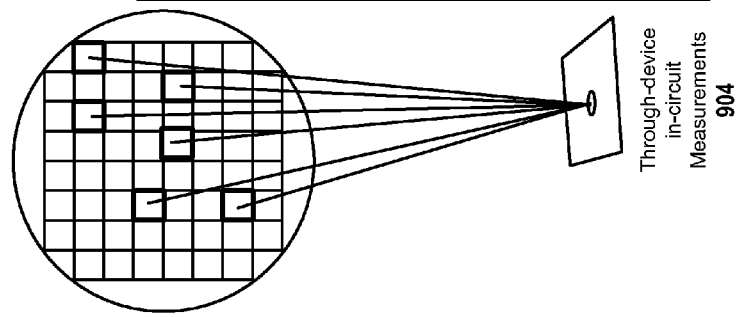

Through-device in-circuit Measurements 904

FIG. 9

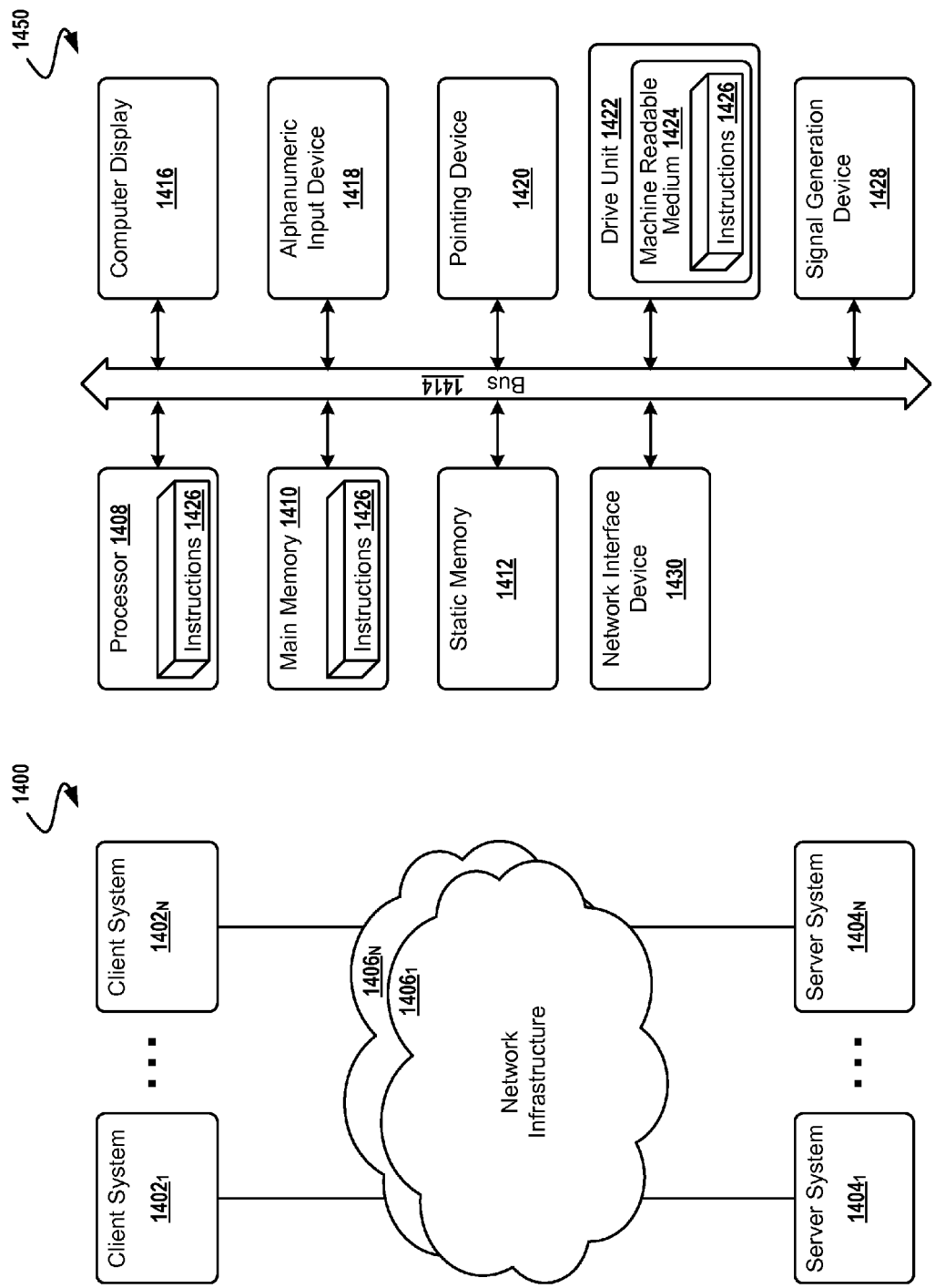

AT-SPEED INTEGRATED CIRCUIT TESTING USING THROUGH SILICON IN-CIRCUIT LOGIC ANALYSIS

RELATED APPLICATIONS

The present application claims the benefit of priority to U.S. Provisional Patent Application Ser. No. 61/623,442, filed Apr. 12, 2012, entitled "Through Silicon In-Circuit Logic Analysis" which is hereby incorporated by reference in its entirety.

FIELD

The disclosure relates to the field of integrated circuit (IC) wafer and die testing and more particularly to techniques for at-speed observation and analysis of a pre-selected set of sites of an IC for fast through-silicon in-circuit logic analysis.

BACKGROUND

Integrated circuits (ICs) contain up to billions of gates or transistors that change their electrical state in sequences that perform the functions of the IC. These ICs have external connections (bumps, pins, etc.) that are routed to other electrical components to allow the ICs to perform as part of a system. ICs may fail to operate properly at any time during design, manufacture, or after shipment to users of the products in which they are installed. During manufacture, ICs are typically tested at two stages. The first stage is while the ICs, customarily referred to as "die", are still on the wafer that is patterned with other die during manufacture. The wafers are placed in a wafer prober and accessed for testing with a pin pad that connects to the external connections and routes these electrical paths to an automatic tester (ATE). The second stage generally occurs after the die are removed or separated from the wafer and prepared or packaged as a finished product. The finished product packages are typically placed in a socket that provides an electrical connection through the contacts of the package to the die for testing with an automatic tester (ATE).

Electronic devices (e.g., transistors, diodes, etc.) and their respective active regions inside the IC are connected with metal lines or traces, sometimes many layers of metal lines or traces. The side of the die that has these metal lines and is customarily referred to as the "frontside". The opposite side, customarily referred to as the "backside" or substrate, has no metal connections. Bed-of-nails connectors or other electrical probes facilitate testing inside the IC. For example, legacy probing was performed by establishing contact between metallic or otherwise conducting probes to the frontside metal lines. In more recent years, this has become increasingly problematic as the layers of metal lines increases. However, since direct access to the active regions is available through the backside, various techniques have been developed to allow access through the backside to determine voltages, parametrics, logic states, and other information or electrical properties of the electronic devices. Tests (e.g., creating perturbations of voltages and currents) are carried out by external test equipment by applying signals to the external connections on the die, then some technique is applied in order to read perturbations at or around one or more active regions (e.g., a transistor of a buffer or gate, or a transistor of a sequential logic element).

Some techniques applied in order to read or create perturbations of one or more active regions take advantage of certain properties of the silicon substrate; in particular, the property that infrared light can pass through the substrate, and a portion of the infrared light is reflected back through the substrate. Some light-based techniques are briefly discussed below:

Light Induced Voltage Alteration: Reading perturbations of one or more active regions is sometimes possible using light-induced voltage alteration (LIVA). Using this technique, external test equipment (e.g., ATE) applies certain electrical potential and applies other conditions to the external connections of the IC to bring and hold the internal electrical states into a known static state. Then, external illumination is provided through the substrate of the IC (e.g., through to various internal areas). A change in the power supply demands from the external test equipment (e.g., ATE) as a result of perturbation from the external illumination is used to indicate the logic state of the device. Unfortunately, techniques used to date provide only gross measurements, and detection of the changes in logic are far slower than the clock rates of modern ICs, thus rendering this technique suited for only some forms of static analysis.

Photon Emission Mapping: This legacy technique uses external test equipment to apply electrical conditions to the external connections of the IC, thus to move the internal electrical state to a particular state. Photons reflected from the various active areas at infrared (IR) wavelengths are detected with an IR camera. Emission strength indicates logic states across the field of view. Unfortunately, techniques used to date provide only gross measurements, and detection of the changes in the infrared wavelengths are far slower than the clock rates of modern ICs, thus rendering this technique suited for only some forms of static analysis.

Dynamic Laser Probing: Laser-based illumination is reflected from the active regions carrying electronic perturbations at or near the active regions. The perturbations are converted into electrical signals by detectors. Electronics states within the IC are varied over a time period, and the changes in the perturbations are detected as the states vary over the same time period.

In some cases, the outputs of these detectors have been used with analog measurement tools to sweep a field of view and to locate changing values that are changing at specific frequencies. Such detected frequencies are marked spatially with symbols on an image of the part. In other cases, these techniques use signal digitizing tools such as oscilloscopes at a single point to examine timing measurements. One application has been to display several cycles of a signal to measure rise time, pulse width, jitter, and other timing related parameters.

Unfortunately, the limitations inherent in the aforementioned light-induced voltage alteration and dynamic laser probing techniques render such legacy techniques unable to meet the demands of high-speed wafer-level and at-speed testing.

Moreover, none of the aforementioned technologies have the capabilities to perform the herein-disclosed techniques for at-speed integrated circuit device observation and analysis of a pre-selected set of sites for fast through-silicon in-circuit logic analysis. Therefore, there is a need for an improved approach.

SUMMARY

The present disclosure provides an improved method, system, and computer program product suited to address the aforementioned issues with legacy approaches. More specifically, the present disclosure provides a detailed description of techniques used in methods, systems, and computer program products for at-speed integrated circuit device observation and analysis of a pre-selected set of sites for fast through-silicon in-circuit logic analysis.

Herein disclosed are systems and methods for extracting dynamic logic state and/or timing information from an IC by detecting and analyzing radiation (e.g., radiation reflected off the IC, radiation emitted by electronic components within the IC, attenuation of illumination radiation after incidence on the IC, etc.). An exemplary system comprises electrical and/or optical detection circuitry to receive emitted or reflected signals from a target location within the IC, and further comprises system components (e.g., any combination of hardware and software) to analyze the detected signals in order to determine logic states, to determine changes in logic states, and to determine timing information vis-à-vis changing logic states.

In one embodiment an optical microscope receives a reflected light beam (e.g., a laser beam) having a modulated amplitude and phase (e.g., where the amplitude and phase has been modulated as a result of interaction with carriers in a transistor). The signal is converted into electrical signals (e.g., outputs from a fast photoreceiver), which signals are in turn conveyed to a high-speed digitizer. The digitizer performs time-wise integration and/or filtering/weighting/averaging (e.g., using FIFOs (First In First Out), dual banked memory buffers, FIR (Finite Impulse Response) filters, etc.). The digitizer is configured so as to achieve a given processing latency when performing time-wise integration and when communicating with an outboard signal processor. The outboard processor accumulates the averages then processes the conditioned signal data to extract the timing of occurrence of a particular logic state, and processes the conditioned signal data to extract the timing of logic changes at any one or more of a set of nodes inside the IC.

In some embodiments, spatial information (e.g., XY coordinate system) pertaining to particular devices within the IC is extracted from a CAD (Computer Automated Design) database. Such spatial information pertaining to particular devices within the IC can be used to determine particular areas of interest, which in turn can be stimulated and probed (e.g., using a laser beam, using a laser beam in combination with ATE, etc.).

Probing only particular points of interest or probing only particular devices within the IC serves to eliminate unnecessary, wasteful and time consuming scans and processing of sensor data for the entire scan (e.g., even for areas outside of the area of interest). Such probing of only particular areas of interest, or probing of only particular devices within the IC, can be accomplished using various configurations of the methods and apparatus as disclosed herein. Further, detecting logic state information or changing logic states that occur resulting from varying a signal in the active region of a semiconductor integrated circuit (IC) can be cross-checked to confirm a "match" or "mismatch" vis-à-vis expected values.

Light-based probes can be implemented using an illumination source operated at an infrared wavelength, which light-based probe or probes are steered to an active region of an electronic device through the backside substrate of an IC. A reflected portion of the steered beam exhibits detectable modulations resulting from interaction of the steered beam with electrons and holes present at the active region. The reflection has a return path that is directed to a detector. The digitized signal is processed using a combination of techniques including (but not limited to) filters, fast Fourier transforms (FFT), and customized signal processing methods. The processing recovers the logic state or states, and the recovered logic state or states become operands of a logic comparator. A "match" or "mismatch" (e.g., as compared to a reference logic signal) is determined, and saved, and/or reported.

A method, system, and computer program product for integrated circuit wafer and die testing are disclosed. The method commences by selecting areas of interest accessible from a backside of an integrated circuit where the areas of interest correspond to electronic devices (e.g., gates or transistors or vias or pads). Then, using a small-beam light source such as a laser, processes for illuminating the areas of interest and collecting the reflected signal returned from illuminated areas of interest are performed. A processor analyses the reflected signal to determine logic states and timing information of the electronic devices, and compares the determined logic states and timing information to a pre-determined logic pattern to determine if one or more errors in the electronic devices are observed. Specific points within an area of interest are determined from CAD layout data, and the pre-determined logic patterns can be retrieved from CAD simulation data.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

FIG. 5B shows a series of Shmoo plots to determine failure causality as used within systems that implement at-speed integrated circuit device observation and analysis of a pre-selected set of sites for fast through-silicon in-circuit logic analysis, according to some embodiments.

FIG. 9 is a schematic depicting a node isolation technique using a sequence of observations from a stepped optical microscope as used in systems for at-speed integrated circuit device observation and analysis of a pre-selected set of sites for fast through-silicon in-circuit logic analysis, according to some embodiments.

FIG. 14 is a block diagram of a computer system for implementing embodiments of this disclosure.

DETAILED DESCRIPTION

Some embodiments of the present disclosure address the problem of slow and wasteful scan techniques, and some embodiments are directed to an approach for implementing at-speed integrated circuit device observation and analysis of a pre-selected set of sites for fast through-silicon in-circuit logic analysis. More particularly, disclosed herein and in the accompanying figures are exemplary environments, methods, and systems for analysis of a pre-selected set of sites for fast through-silicon in-circuit logic analysis.

Overview

Figure 1A:
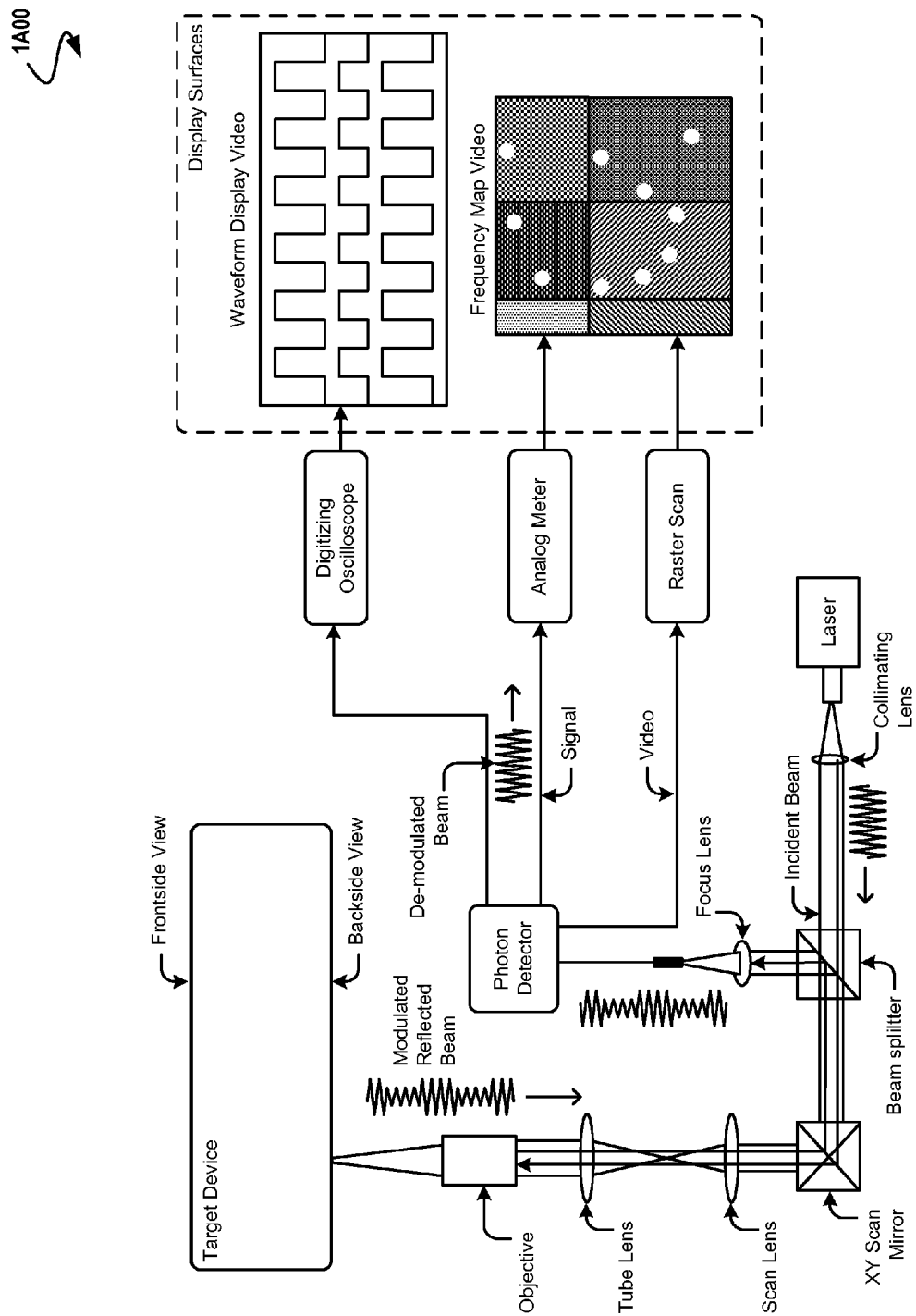
FIG. 1A is a schematic of a scanning optical microscope.

A system for implementing dynamic laser probing techniques is depicted in FIG. 1A. As earlier indicated, legacy uses of laser probing suffer from severe limitations and have not kept pace with IC design, fabrication, and test techniques (e.g., smaller feature sizes, higher clock rates, lower power operation, and increasingly expensive time-on-tester expenses) such that acquisition of device information using legacy laser probing becomes impractical. There is a need for systems and methods to quickly (e.g., at high clock rates) identify and locate incorrect logic states and/or identify and locate (e.g., both temporally and spatially) complex logic patterns within the internal devices comprising the IC under test.

Unfortunately, aforementioned legacy techniques are hindered by extremely low reflected signal strength necessitating multiple samples per site and resulting in the need for repeated sampling, thus resulting in very long signal acquisition times. Moreover, the shown analog detector tools exhibit long acquisition times due to slow responses within the analog circuitry. This causes the entire downstream tool chain to suffer from long acquisition times due to the need to process a large number of signal samples (e.g., to filter a large number of signal samples over a long time period in order to find a signal). In some legacy situations, the processing time required to analyze gigasamples per second of data creates "dead time" between sample bins, causing the samples to "pile up". Typically, a very large percentage of samples are rejected due to this "piling up" problem. Using the legacy raster-scan techniques, the rejected samples often exceed 99% of the total samples taken.

Figure 1B:
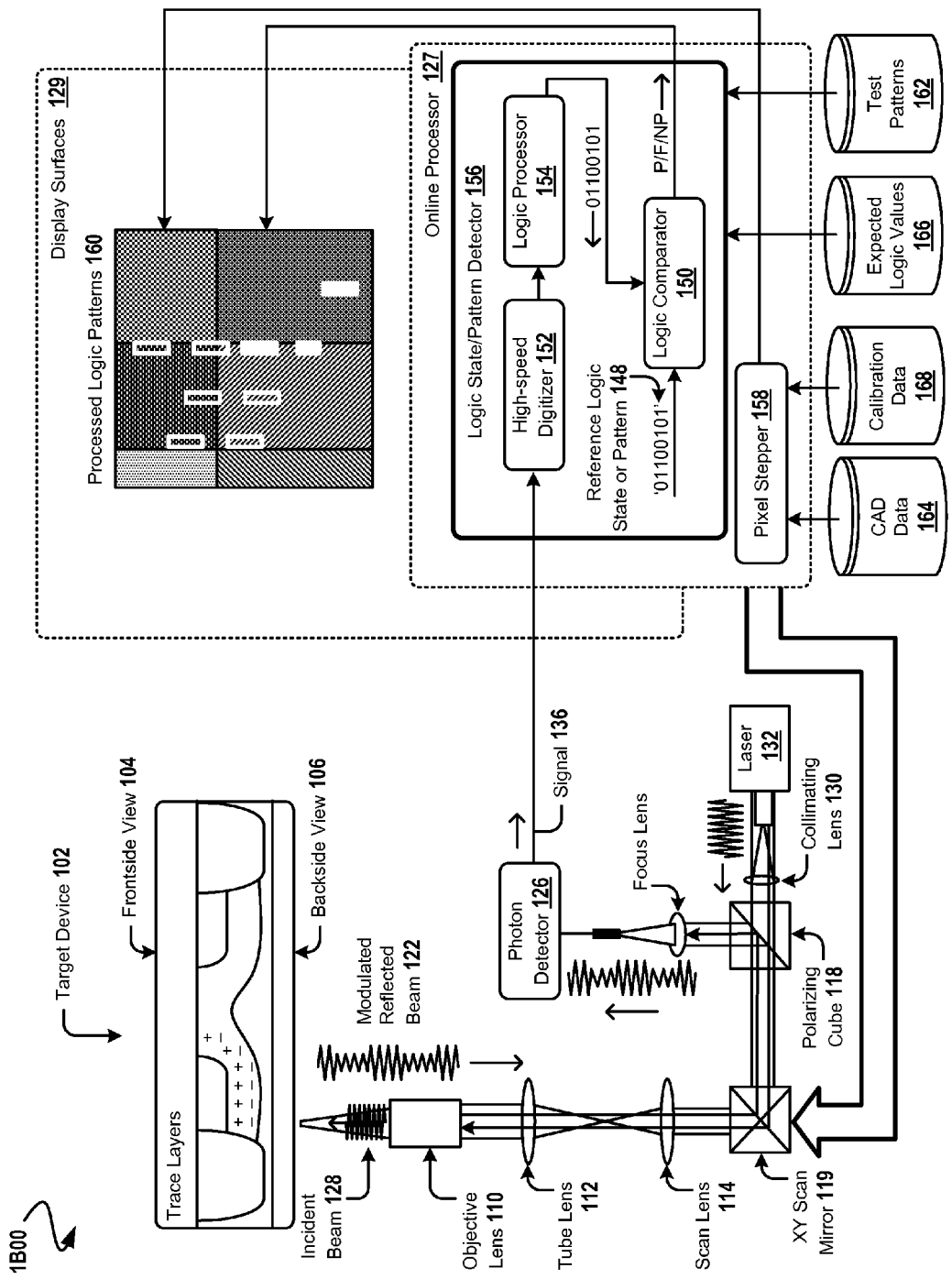
FIG. 1B is a schematic of a stepped optical microscope as used in systems implementing at-speed integrated circuit device observation and analysis of a pre-selected set of sites for fast through-silicon in-circuit logic analysis, according to some embodiments.

To overcome deficiencies of the aforementioned analog detector tools, high-speed digitizers exhibiting low latency are used (see FIG. 1B). For example, one embodiment of a high-speed digitizer accomplishes low latency using a dual banked memory such that samples can be collected (into one memory bank) while the other memory bank serves as a repository for access by an outboard processor.

Additional advanced techniques are disclosed herein, and some such techniques are referred to herein as "in-circuit dynamic logic pattern analysis" and "high-speed, through-silicon dynamic logic pattern analysis". Various embodiments of high-speed, through-silicon dynamic logic pattern analysis is accomplished by implementing the herein-disclosed apparatus and methods (e.g., using the apparatus as shown in FIG. 1B). Various apparatus configurations receive a series of digital samples at a rate at least as high as with legacy techniques; however, since embodiments of the instant disclosure can direct analysis to a smaller set of pre-selected set of sites (e.g., rather than naively raster-scanning the entire backside of the IC), the number of samples to be analyzed is substantially reduced, and accordingly, following the techniques disclosed herein, the "dead time" incurred by legacy raster-scanning methods is eliminated or reduced.

To illustrate an example, legacy testing technique might incur multiple types and periods of dead times. As examples:

Mismatched Triggering: Detectors trigger in ~125 ns cycles while a legacy analog oscilloscope triggers more slowly, for example at a cycle time of >500 ns. This incurs dead time of >375 ns per cycle.

Digital Signal Processing Time: Using raster-scan and oscilloscope methods, the computing latency while processing an entire raster frame of data can incur significant dead time.

In one case the scan times and dead times mentioned above reduce scan times by only probing particular points of interest (e.g., only points within particular "areas of interest") that are situated in regions where logic values or signals of interest may be present.

In addition, advanced high-speed processing of these digitized samples is accomplished using a combination of customized fast Fourier transforms (FFT) and customized signal processing methods. Such advanced high-speed processing facilitates real-time or near real-time comparisons with reference logic patterns to determine a match between the recovered logic patterns and expected logic patterns. The wasteful raster scanning and frame grabber devices used in legacy systems (e.g., to sweep the entire field of view) is replaced with a pixel-of-interest-by-pixel-of-interest approach that facilitates sparing usage of samples (e.g., only sampling as needed at locations coincident with pixels-of-interest that correspond to intra-chip devices of interest). The greatly reduced time required for implementation of the methods described in the appended figures also serve to achieve fast recovery of logic states and logic patterns. Unambiguous determination of their correctness in relation to reference values and/or reference patterns allows at-speed testing (e.g., in real-time, or at nearly real-time) using in-circuit logic analysis.

Definitions

Some of the terms used in this description are defined below for easy reference. The presented terms and their respective definitions are not rigidly restricted to these definitions—a term may be further defined by the term's use within this disclosure.

The term "Logic" or "logic" refers to logic that can be expressed in Boolean form. Such logic includes forms used to determine attributes like "true" or "false", "pass" or "fail", "match" or "mismatch", "on" or "off", "1" or "0", "bit", "qubit", "bytes", "bit word", etc.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

DESCRIPTIONS OF EXEMPLARY EMBODIMENTS

FIG. 1A is a schematic 1A00 of a scanning optical microscope. As shown, a laser beam is incident on a target device, and the return (e.g., the shown reflected modulated beam) is directed through an apparatus (e.g., a beam splitter) to a photon detector. The outputs of the photon detector are used as inputs to various devices that transduce from photon detections into displays (e.g., waveform displays, raster-type displays, analog meters, etc.).

FIG. 1B is a schematic 1B00 of a stepped optical microscope as used in systems implementing at-speed integrated circuit device observation and analysis of a pre-selected set of sites for fast through-silicon in-circuit logic analysis. As an option, the present schematic 1B00 may be implemented in the context of the architecture and functionality of the embodiments described herein. Also, the schematic 1B00 or any aspect therein may be implemented in any desired environment.

As shown, a target device 102 (e.g., an IC) has a frontside view 104 and a backside view 106. A laser 132 produces an incident beam 128 that is steered to an illumination location on the backside of the target device. The incident beam might be collimated (e.g., using collimating lens 130) and might be polarized (e.g., using a polarizing cube 118, possibly with a beam splitter). The incident beam might be steered at a fixed angle by a mirror or might be steered to any arbitrary XY location on the backside of the IC (e.g., using XY scan mirror 119). The beam may be further conditioned using a scan lens 114, a tube lens 112, and an objective lens 110 before the beam is incident on the IC. The radiation of the beam interacts with the charge carriers within the IC, and the reflection of the beam from the IC is modulated by such interactions to create a modulated reflected beam 122. Re-traversing the incident beam path in reverse serves to steer the return through the beam splitter and into a photon detector 126.

Continuing with the discussion of the apparatus shown in schematic 1B00, outputs of the photon detector 126 include signal 136, which becomes one of several inputs to a logic state/pattern detector 156.

The output signal from the photon detector, shown as signal 136, results from detection of photons that are then transduced into an electrically-varying signal. In exemplary embodiments, the signal 136 is processed by a high bandwidth preamp and a bias tee (e.g., to separate AC components from the DC components of interest). The DC components can be used for various forms of imaging. The AC components are further amplified (e.g., using a high bandwidth amplifier) and provided to inputs of a digitizer.

The input (from signal 136) is digitized (e.g., using a high-speed digitizer 152) to recover changes in the signal corresponding to detected logic values and/or logic value changes. A logic processor 154 processes the detected logic values and/or logic value changes to put the received signal into a form suited for comparison with logic values retrieved from a database. For example, and as shown, the logic state/pattern detector 156 can retrieve logic values from test patterns 162 and/or from expected logic values 166. Thus, given a string of logic values from the logic processor 154 and a string of logic values from expected logic values 166, a logic comparator 150 can be employed to determine a pass (P), or fail (F), or not present (NP) indication. Various such indications corresponding to pass, or fail, or not present are further discussed below.

As shown, signal 136 is processed through an online processor 127 and results of the online processor 127 (e.g., results of the logic comparator) are displayed on display surfaces 129, for example, showing locations and/or logic values, and/or waveforms of processed patterns 160. The CAD data 164 and calibration data 168 are used with a pixel stepper 158 to control the display of logic comparisons on an XY representation of the backside view 106 of target device 102. Logic values of specific devices are superimposed atop the XY representation of the backside view 106 of target device 102 and displayed on display surfaces 129.

Reference Patterns

Now, still discussing techniques employing reference patterns, the reference patterns may be generated by capturing patterns of interest from:

Other circuit locations within the same IC or other ICs. For instance, a logic pattern measured at the first cell of a scan chain can be used as a reference logic pattern to apply to scan cells further down the chain. Thus, a reference pattern can be used to search for the location of a broken cell in the scan chain.

Direct input from the user.

External test equipment.

Other external software.

Strictly as examples, designers of ICs have knowledge of expected logic states and patterns that exist within their IC (e.g., from logic simulation, from fault simulation, from automatic test pattern generation (ATPG), etc.). Some logic states may comprise a repeating cycle, such as in the case of "clocks" or "clock trees". These clocks may be used to step logic states or functions within the IC. In another example, the logic states may be grouped into logic patterns arranged as logic words used to instruct actions in various portions of the IC. Logic patterns may also be stored in blocks of information in the memory areas of the IC. Some ICs have designs that place special circuitry (e.g., built-in self-test (BIST) circuitry) located in pre-defined areas of the IC. Such special circuitry is used to provide additional "test" information about operation of the IC for the designers. A common example of such special circuitry is "shift registers" that are placed in cascades or chains commonly referred to as "scan chains". Special logic patterns (e.g., fault simulation vectors) are passed through the scan chains in order to load in known test patterns and then detect failures within the IC where the measured results do not match the expected results. In some cases, sequences of measurements (e.g., detected behavior within the IC where the measured results do not match the expected results) can be fed into a simulator, and the simulator can hypothesize as to the causes, sources, and locations corresponding to why measured results do not match the expected results.

The techniques discussed herein, and the implementation of the online processor 127, serve to spatially locate (e.g., using XY coordinates) target areas such as the active region of transistors or other electronic devices within these shift registers in order to direct the illuminating laser beam only to these specific target areas. The pass, fail, or non-presence condition may be reported to the user, external test equipment, or converted into visual indicators and superimposed spatially on the IC image or a graphical representation of the circuit components (CAD display). The visual indicators may be colored rectangles, dots, binary strings, or other formats useful to the user. For example, an image of each of the above shift registers may be outlined with a green (or open) rectangle for pass, or a red (or solid) rectangle for fail, or some other screen device to represent no modulation. If the user's software provides sequencing, this method would also provide spatial and logical determination of the specific location of the mismatched register in the sequence. A mismatched register in the sequence or other behavior classified as 'failed' might actually be located to an area of interest corresponding to an area in between the last 'passing' cell and the first 'failed' cell. Formats or display techniques other than the aforementioned rectangles may be used. Some such display techniques are presented in FIG. 3A, FIG. 3B, and FIG. 4.

As can be seen, use of the herein-disclosed techniques and systems (e.g., the new digitizing apparatus, custom FFT routines, custom signal processing, etc.) eliminates or greatly reduces "dead time" as well as overall measurement-taking times. Embodiments such as is shown in the online processor 127 of FIG. 1B serve to rapidly determine correctness of logic states or logic patterns. Further, such techniques and systems can also be used to significantly improve recovery time of a signal waveform from optical measurements. In some cases, a high-speed digitizer can receive emitted or reflected signals from a target location within an IC, and can render a waveform. Such a waveform can be rendered into "logic" or Boolean form for logic comparison purposes.

Figure 1D:
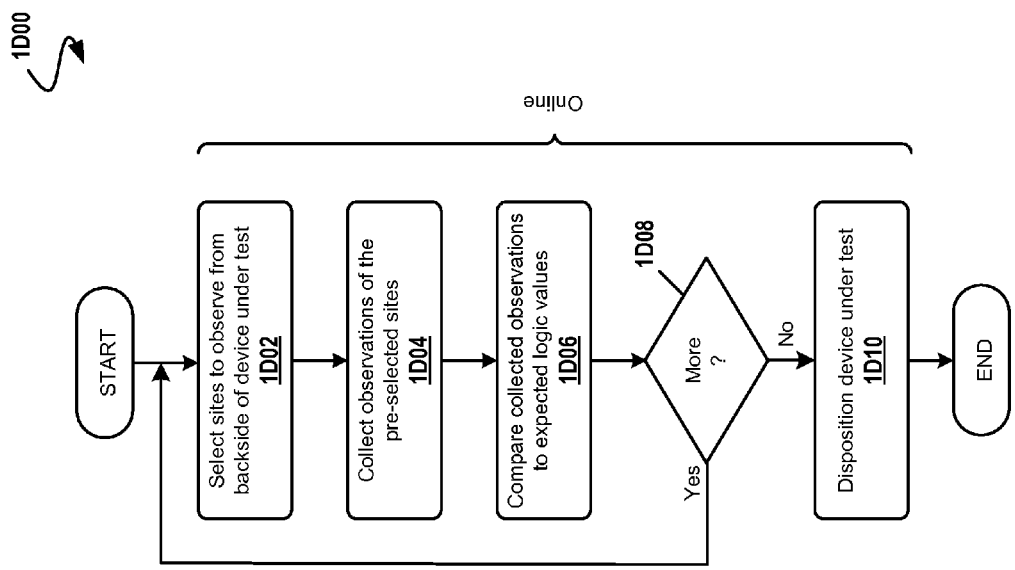
FIG. 1D is a flow chart showing a fully online procedure to implement at-speed integrated circuit device observation and analysis of a pre-selected set of sites for fast through-silicon in-circuit logic analysis, according to some embodiments.
Figure 1C:
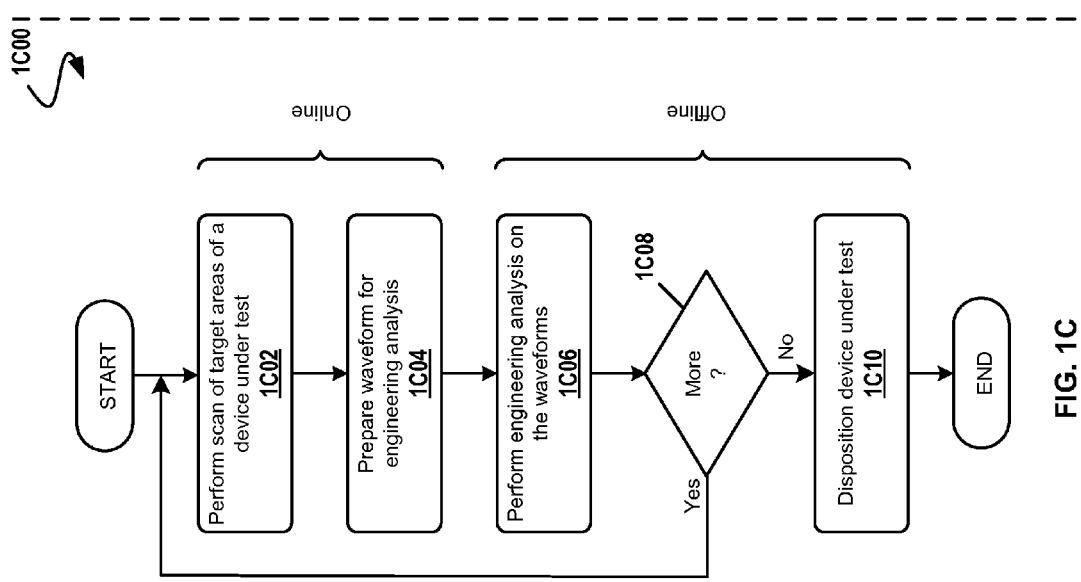
FIG. 1C is a flow chart showing a mixed online/offline procedure.

FIG. 1C is a flow chart 1C00 showing a mixed online/offline procedure. As an option, the present flow chart 1 C00 may be implemented in the context of the architecture and functionality of the embodiments described herein. Also, the flow chart 1C00 or any aspect therein may be implemented in any desired environment.

As shown, an online process to perform a scan of target areas of a device under test is commenced (see operation 1C02). The scan data from the target areas is processed (e.g., into a waveform), and certain of the samples are selected for further analysis (see operation 1C04), possibly with the intent to carry out offline processes such as human engineering analysis (see operation 1C06). In some cases, an engineer would determine that more sample data is needed to further the analysis, and if so, the procedure loops back (see decision 1C08), or the engineer proceeds to disposition the device under test (see operation 1C10).

While this technique can yield results following the techniques as disclosed herein, the steps to disposition a device under test can be performed using fully-online procedures, and can be performed substantially without, or completely without, human intervention. Such a procedure is now discussed.

FIG. 1D is a flow chart 1D00 showing a fully online procedure to implement at-speed integrated circuit device observation and analysis of a pre-selected set of sites for fast through-silicon in-circuit logic analysis. As an option, the present flow chart 1D00 may be implemented in the context of the architecture and functionality of the embodiments described herein. Also, the flow chart 1D00 or any aspect therein may be implemented in any desired environment.

As shown, the flow commences by selection of sites to observe from the backside of the device under test (see operation 1D02). The sites of interest (e.g., which scan cells of a scan chain) can be determined from CAD data 164 (e.g., using simulation model data), and the specific XY location to probe with the laser probe can also be determined from the CAD data (e.g., using GDSII polygon data). The laser beam and detector can be steered to any one or more specific selected sites (e.g., using a pixel stepper 158). Data from the laser probe of the XY locations can be collected (see operation 1D04) and the logic values corresponding to the collected samples can be compared to expected logic values (see operation 1D06). If there are more sites to observe, then the procedure loops back (see decision 1D08) or, the device under test can be dispositioned (see operation 1D10).

Using the technique given in flow chart 1D00, pre-selected sites can be rapidly observed and compared against expected data. Specifically as some examples, a device under test might be at first subjected to tests of the I/O pads and proximal buffers. Or, a device under test might be subjected to tests of on-chip clock trees, etc. Or, the device might be subjected to a scan shift test or a scan flush test, and/or logic nodes could be systematically sampled to compare observed behavior with results predicted from logic simulation. Still more sophisticated tests can be performed, possibly including coordination with automated test equipment to identify logic matches and mismatches. Some such tests are now discussed.

Figure 1E:
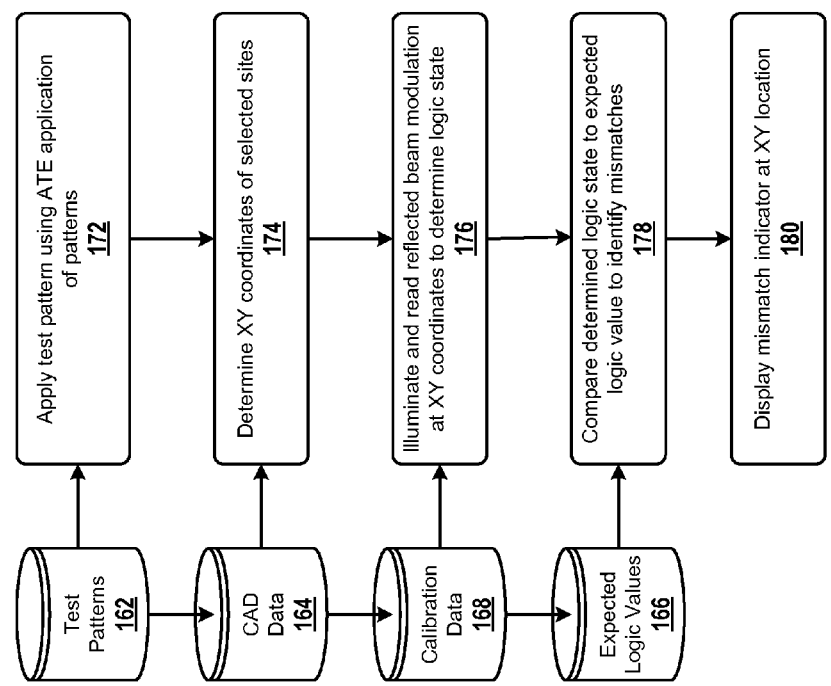
FIG. 1E is a flow chart showing a procedure to identify logic mismatches in systems that implement at-speed integrated circuit device observation and analysis of a pre-selected set of sites for fast through-silicon in-circuit logic analysis, according to some embodiments.

FIG. 1E is a flow chart 1E00 showing a procedure to identify logic mismatches in systems that implement at-speed integrated circuit device observation and analysis of a pre-selected set of sites for fast through-silicon in-circuit logic analysis. As an option, the present flow chart 1E00 may be implemented in the context of the architecture and functionality of the embodiments described herein. Also, the flow chart 1E00 or any aspect therein may be implemented in any desired environment.

As shown, a database of test patterns 162 can be used to drive automated test equipment (see operation 172), and CAD data 164 can be used to steer the laser and detector to specific XY coordinates in order to identify XY coordinates of selected sites (see operation 174), and then to illuminate those specific XY coordinates using laser probes in order to read the logic values at said sites (see operation 176). In some cases, the illumination equipment is calibrated so the actual site illuminated matches with precision to the CAD data. Calibration data 168 can be collected ahead of a series of tests.

In some embodiments, the system performs a three-point alignment to translate device coordinates from the database into stage coordinates of the system (e.g., see pixel stepper 158). Thereafter, the spatial location of logic cells (e.g., scan cells) can be translated to the scanning optical microscope (SOM) stage coordinates and then scanned or probed within the cell(s) only in the form of separated automated optical inspections performed within an area of interest (AOI). Additional calibration techniques are further discussed in conjunction with FIG. 7B.

Given the read and determined logic values at said XY sites (see operation 176), the determined logic value can be compared to expected logic values (see operation 178). Matches and mismatches can be displayed at a corresponding XY location on a display surface (see operation 180).

A match of a particular probed logic value can be displayed, as can be a mismatch. In some embodiments a particular time-series of logic values is needed to verify expected operation. A time-based logic pattern in a loop sequence (e.g., using a generated reference logic state or pattern 148) can be used in conjunction with a laser probe to illuminate specific XY sites in order to read the time-variant logic values at said sites.

Figure 2:
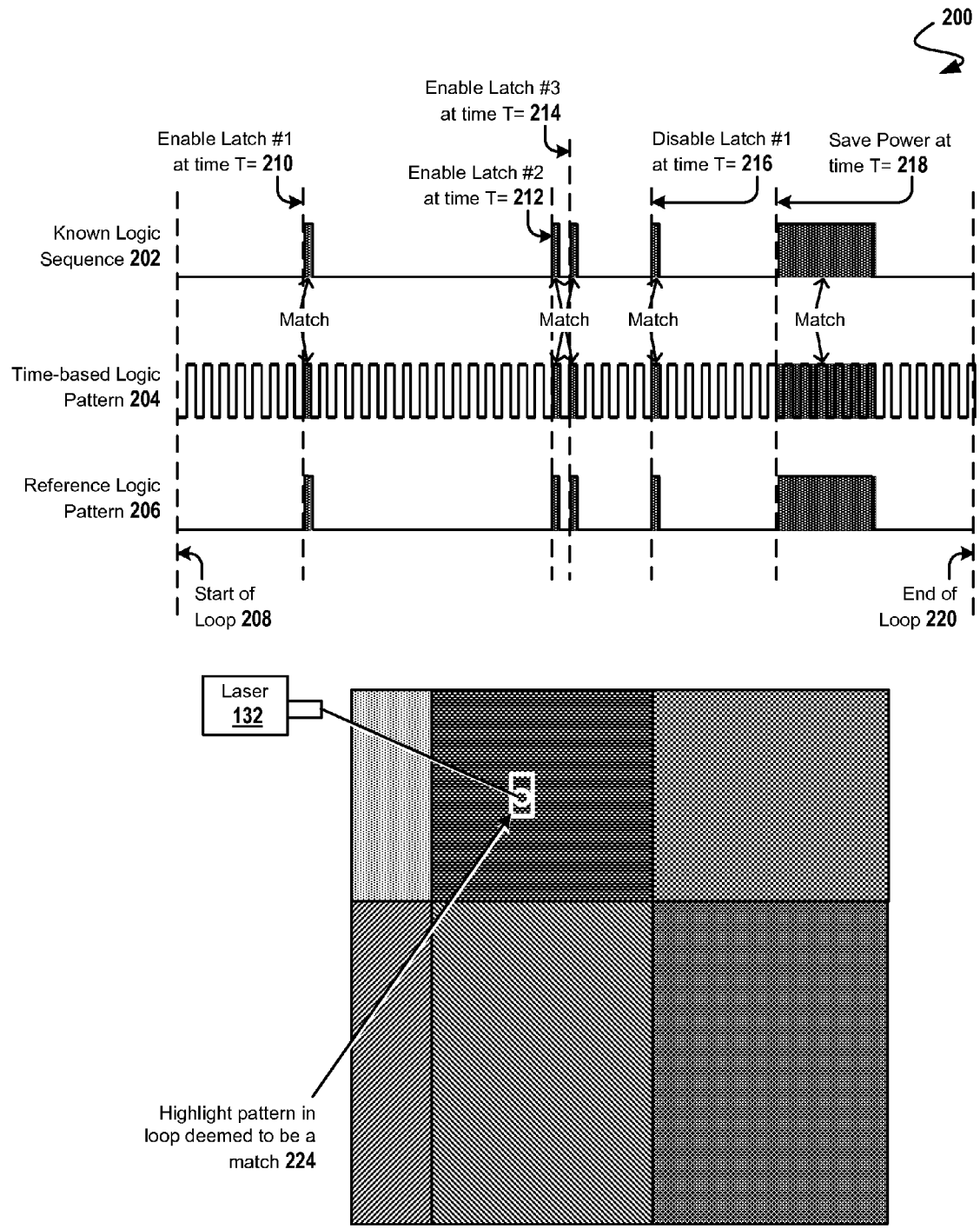
FIG. 2 depicts an analysis technique to analyze a time-based logic pattern in a loop sequence to verify and highlight expected logic transitions as used in systems to implement at-speed integrated circuit device observation and analysis of a pre-selected set of sites for fast through-silicon in-circuit logic analysis, according to some embodiments.

FIG. 2 depicts an analysis technique 200 to analyze a time-based logic pattern in a loop sequence to verify and highlight expected logic transitions as used in systems that implement at-speed integrated circuit device observation and analysis of a pre-selected set of sites for fast through-silicon in-circuit logic analysis. As an option, the present analysis technique 200 may be implemented in the context of the architecture and functionality of the embodiments described herein. Also, the analysis technique 200 or any aspect therein may be implemented in any desired environment.

The analysis technique of FIG. 2 shows an a priori known sequence of logic states. The known sequence of logic states contains states that enable other circuit actions such as switching a latch or executing power down to sections of the circuitry. In this embodiment, a time-based logic pattern 204 is generated as is appropriate to the known chain conditions. Expected occurrences or periods of "matches" between the known states and the time-based logic pattern are used to create a reference logic pattern 206 that may then be used in testing for the expected sequence in a loop (see start of loop 208 and end of loop 220). The time-based logic pattern may also be devised such that timing failures (e.g., violated setup or hold conditions) may be detected and subsequently reported.

As shown, a reference pattern is generated, which reference pattern is compared to a series of measured logic states. In the case of the waveforms of FIG. 2, the reference pattern (e.g., the shown series of logic states) is used to enable and disable latches (e.g., see time T=210, T=212, T=214, T=216) and to power-down sections of the circuitry (e.g., see time T=218). In some cases the reference pattern follows a repeating pattern, and as such, may be considered as a loop. The reference pattern and the measured logic states are compared (e.g., using logic comparator circuitry), and the comparison determines a match/no-match for each clock cycle. The "matched" bits are then used for pass/fail testing criteria. Filters, pre-emphasis, and other signal processing techniques can be used to facilitate detection of timing errors (e.g., set-up or hold time violations) in and around the edges of the acquired logic states.

A software module can be used to loop a test and to compare the recovered logic states (and timing information) to a reference signal in order to determine correctness of the logic patterns and to verify observation of timing constraints. The loop can be executed, and executed again in a repeating pattern, such that so long as the expected patterns of the loop are present for real-time probing, the area of interest (e.g., see match 224) remains visibly highlighted. For example, and as shown, an area on the display surface corresponding to a particular XY location can be highlighted.

The aforementioned reference pattern(s) can be determined from simulation data, or from user defined patterns, or can be derived from measured "known good" cell behavior. The comparison can be done without regard to phase (amplitude correlation) or phase correlated if required since the phase information is collected. In some cases, a logic pattern (e.g., changing values over a time period) might exactly match expected values as the phase of the reference signal is shifted. The phase shifting can also be shown in conjunction with a waveform image, or can be presented as isolated phase information.

Such reference patterns can be extensive, and can be performed at high speed. Error checking methods within the system can validate pattern matches or non-matches. In some cases precise clock-by-clock data values might not be known from CAD data, although a measured device might be expected to follow the behavior of some other addressable and/or measurable location at the chip periphery or at some location within the chip. For example, by using extracted logic states, bit error checking methods can be applied to reduce errors. In fact, following the techniques disclosed herein, it is possible to check proximal logic (e.g., down stream logic) to see if the bits "recovered"; in that case, a previously-reported mismatch was actually a false negative. Such error checking greatly improves the accuracy of the results and performs better overall as compared to previous methods. As another example, application of algorithms to perform checking logic patterns in and around areas of interest can report non-matching observations in order to localize logic failures.

In some cases correlation of non-matching observations serve to isolate electronic device faults to within proximity of one gate. For example, when observing an IC from the backside using a laser probe, false positives and negatives can occur. The algorithm can check to see that a logic chain is consistent. Downstream error checking can confirm that multiple logic elements in the chain downstream continue to fail so as to identify or classify "false failures". For example, if the subsequent logic succeeds (i.e., is deemed as a pass) or if the chain is deemed to have "recovered", then the earlier mismatched cell must be functioning properly, and the mismatch can be classified as a "false failure". Such techniques can be used repeatedly in order to calculate a particular correlation probability. For example, one technique checks downstream logic even in the event of a 'false' or 'fail'. A 'false' might have occurred merely because of missing a site or weak signal, however, if the next (e.g., downstream) logic cell "recovers" then it is a statistical probability that the previous cell was in fact good. This situation is known as a "false negative" or "false fail". Statistical metrics can be applied. For example, a corpus of samples can be taken from techniques such as laser assisted device alteration (LADA) that monitor pass/fail. Given such a corpus, the probability of observing a "false pass" might be known to be very small, but observing a "false fail" is more common. Hence, classification algorithms can be weighted accordingly for classifying observations into "false negative" suspects versus "false pass" suspects.

As earlier indicated, BIST can be provided on-chip and can be enabled (e.g., in conjunction with ATE). Accordingly, BIST and periphery stimulation can be used in tandem to implement various testing schemes. For example:
  Spatial random or pseudo-random samples within the AOI or sub-AOI.
  Spatial random or pseudo-random samples within sub-AOIs within the AOI.
Intra-cell Probing Defining areas-of-interest (AOIs) based on the logic sequence helps further reduce the area or sites to be selected for laser probing. Area refinement can be further enhanced by breaking down the AOIs into sub-AOIs (SAOIs) and sample randomly within the AOI or SAOI. Strictly as an example, SAOIs can be used to identify candidate areas (e.g., promising areas) for a signal, and the SAOI then can be still further sampled without the need to repeat the larger AOI set of probes. In some situations, identification of SAOIs can be used to improve laser-assisted device alteration (LADA/SDL) where pass/fail "hits" are observed. SAOIs can be explicitly defined to be areas within a cell, and clusters of "hits" observed in a first scan of an AOI or SAOI can be subjected to further observations in order to confirm the presence (or absence) of a signal.

Figure 3A:
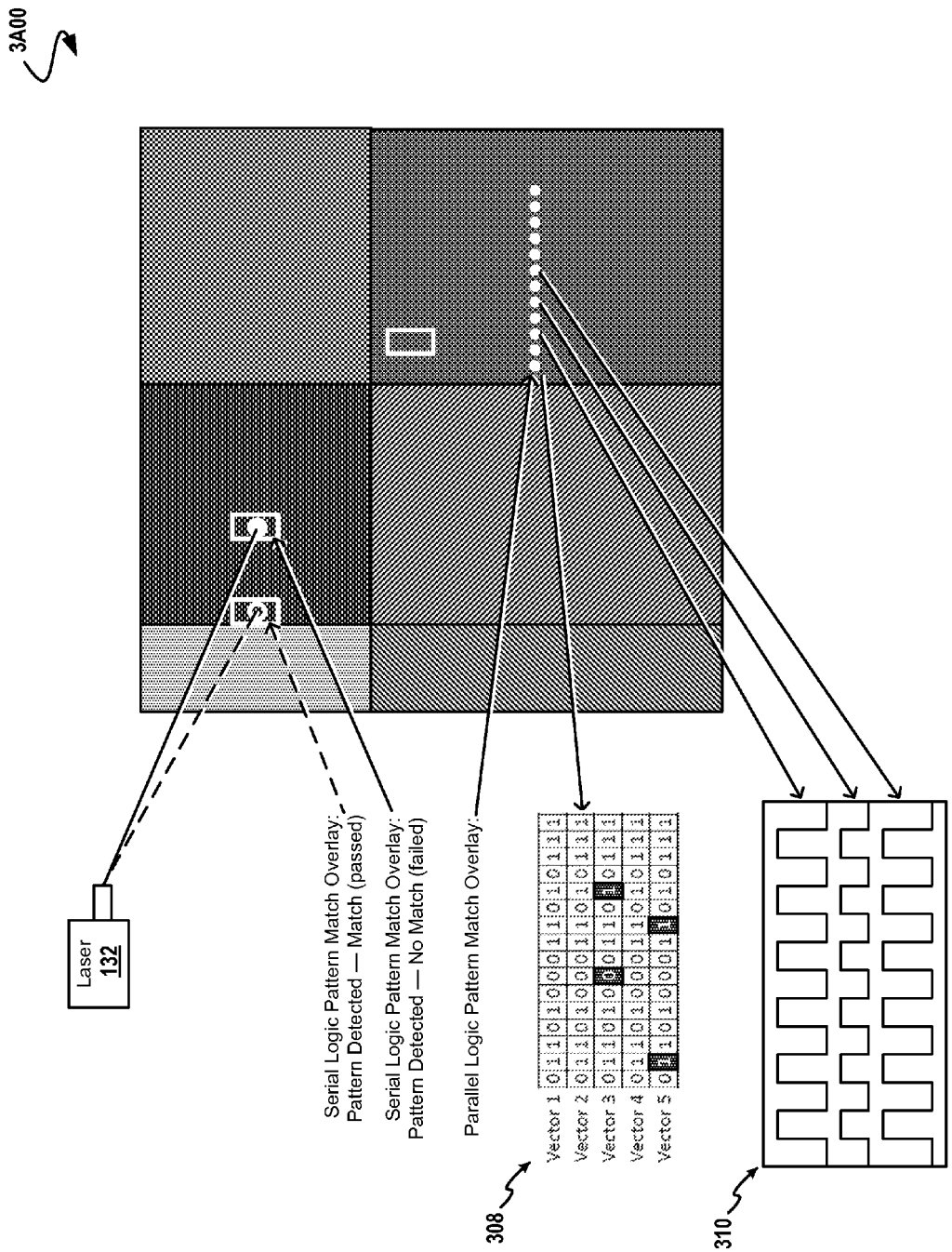
FIG. 3A depicts a display technique to overlay results of multiple time-based logic pattern verification passes as used in systems that implement at-speed integrated circuit device observation and analysis of a pre-selected set of sites for fast through-silicon in-circuit logic analysis, according to some embodiments.

FIG. 3A depicts a display technique 3A00 to overlay results of multiple time-based logic pattern verification passes. As an option, the present display technique 3A00 may be implemented in the context of the architecture and functionality of the embodiments described herein. Also, the display technique 3A00 or any aspect therein may be implemented in any desired environment.

As shown, display technique 3A00 includes a depiction of a laser scanning microscope (LSM) image of an area of an integrated circuit (IC) as viewed from the backside of the IC. Rectangles are superimposed on the image. The rectangle sizes and locations are provided by test equipment and/or the operator and/or software components. The rectangle sizes and locations serve to bound the areas of interest (AOIs) that are expected to exhibit certain logic states or logic patterns that match a particular reference logic pattern. In some embodiments the rectangles may be replaced by other shapes (e.g., convex or irregular polygonal shapes) and can also be labeled with text or numbers or other symbols. The colors and shapes can be defined by a user or obtained from a layout representation (e.g., a GDSII or a Lef-def file).

Any logic value or values from any area or areas of an integrated circuit (IC) detected from viewing the backside of the IC can be imaged in a variety of ways. As shown, a sequence of logic values are depicted using a vector chart 308 and/or a waveform display 310.

Figure 3B:
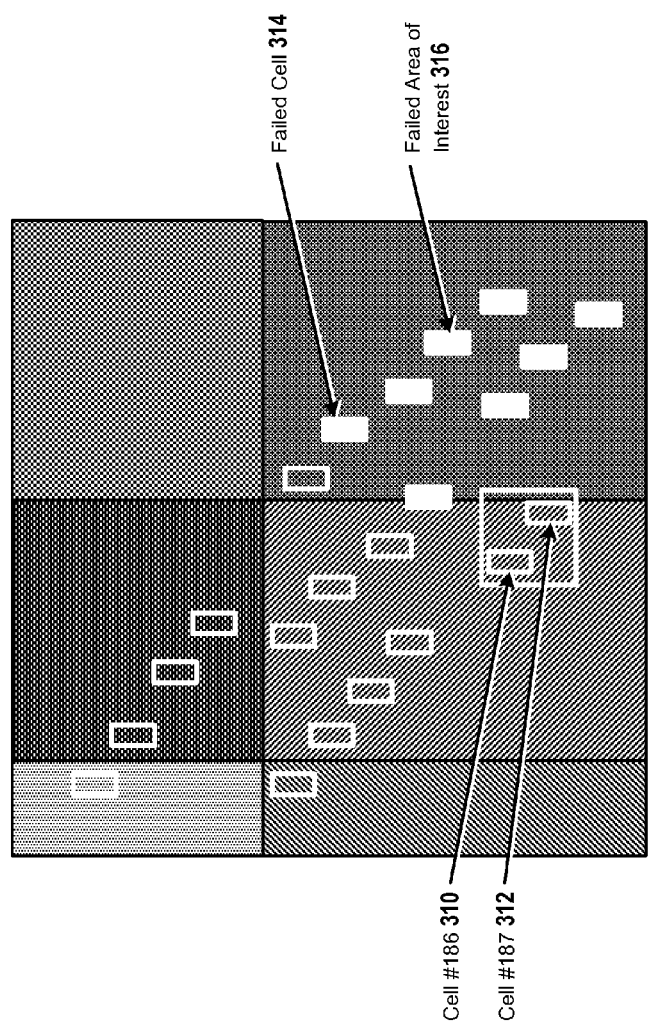
FIG. 3B depicts a bounding technique to identify an area of interest based on overlay results from multiple time-based logic pattern verification passes as used in systems that implement at-speed integrated circuit device observation and analysis of a pre-selected set of sites for fast through-silicon in-circuit logic analysis, according to some embodiments.

FIG. 3B depicts a bounding technique 3B00 to identify an area of interest based on overlay results from multiple time-based logic pattern verification passes as used in systems that implement at-speed integrated circuit device observation and analysis of a pre-selected set of sites for fast through-silicon in-circuit logic analysis. As an option, the present bounding technique 3B00 may be implemented in the context of the architecture and functionality of the embodiments described herein. Also, the bounding technique 3B00 or any aspect therein may be implemented in any desired environment.

FIG. 3B shows similar information as in FIG. 3A except that, in the depiction of FIG. 3B, the logic chain is observed to have a failure. The output of the logic comparator 150 marks some cells as PASS, and some cells as FAIL. For example, the rectangles referring to PASS areas are green or open (see cell 310, cell 312) and the rectangles referring to FAIL areas are red or solid (e.g., see cell 314, cell 316). In some cases, and as shown here, the rectangles are identified with numbered cells (e.g., cell #186 310, cell #187 312, etc.).

Of course color or pattern coding is not the only way to visually assist a human operator, and some embodiments employ usability functions to directly overlay the user defined AOIs as "boxes" or other geometrical shapes that outline each AOI. In some cases a user-defined AOI can serve to create a bounding area of target sites from which sites the XY-addressable laser probes can be steered to extract static or dynamic logic states and timing information.

In other embodiments, one or more AOIs may be defined based on bounding information extracted from a CAD database (e.g., GDSII). In some cases, much of the IC area is used for regular structures (e.g., DRAM) and/or for routing; thus an IC might be only sparsely populated with logic. Hence, techniques that can limit probing to only true areas of interest (e.g., an area where there is logic of interest) serve to avoid wasted time and cycles dedicated to probing areas that cannot yield any useful logic states, or signals or timing information as related to the logic of interest (LOI).

Figure 4:
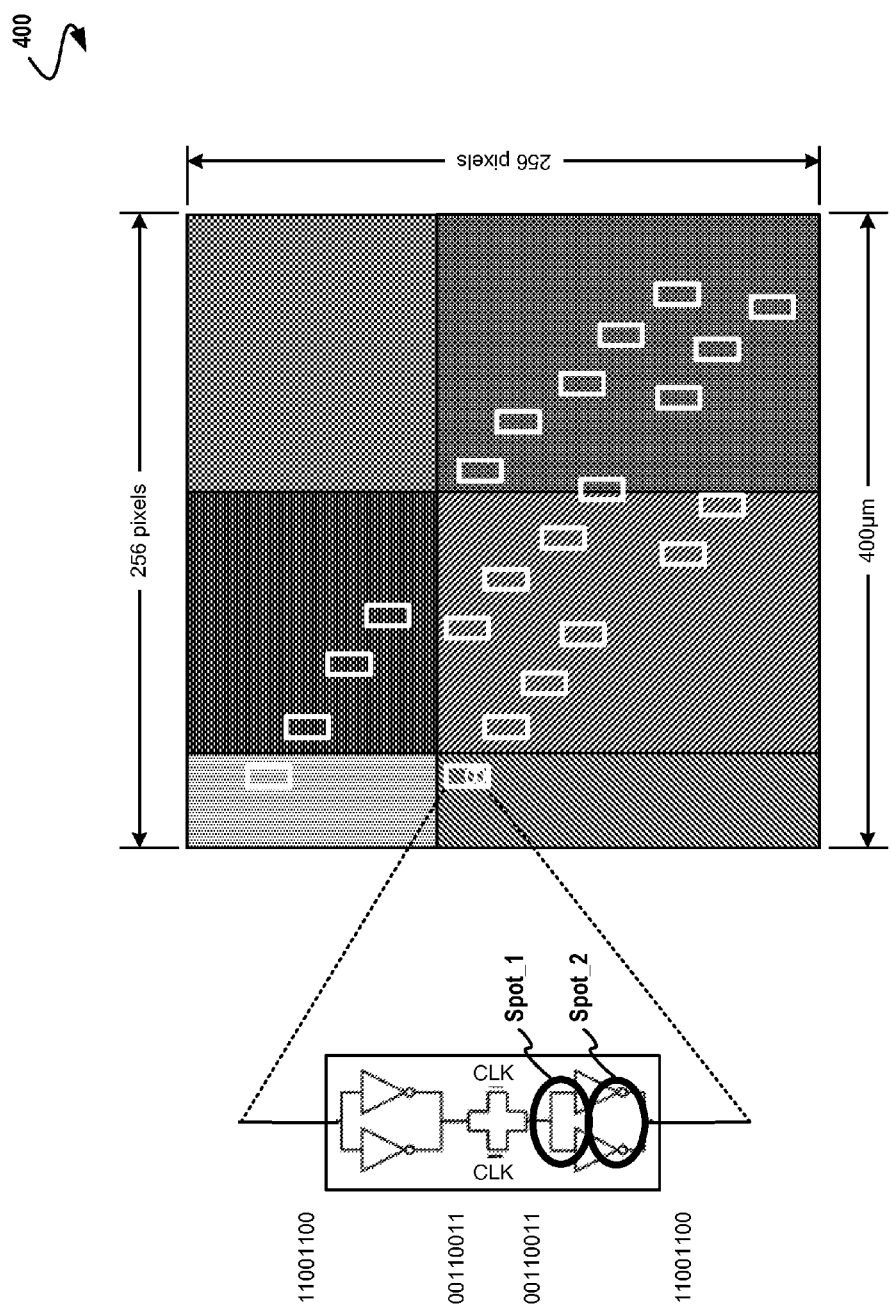
FIG. 4 depicts intra-cell sites having multiple charge carriers that change based on a known pattern for analysis within systems that implement at-speed integrated circuit device observation and analysis of a pre-selected set of sites for fast through-silicon in-circuit logic analysis, according to some embodiments.

FIG. 4 depicts intra-cell sites 400 having multiple charge carriers that change based on a known pattern for analysis within systems that implement at-speed integrated circuit device observation and analysis of a pre-selected set of sites for fast through-silicon in-circuit logic analysis. As an option, the present intra-cell sites 400 may be implemented in the context of the architecture and functionality of the embodiments described herein. Also, the intra-cell sites 400 or any aspect therein may be implemented in any desired environment.

As shown, a particular logic cell (possibly comprising many electronic devices) can become the subject of at-speed integrated circuit testing using through-silicon in-circuit logic analysis. Using an optical microscope, a cell or areas within a cell can be optically probed. In some cases the probe might overlap two or more nodes or electronics devices, and multiple readings (e.g. see spot_1, and spot_2) might be taken and averaged or otherwise combined in order to classify the reading or readings as a pass (P), or fail (F), or not present (NP), and to generate corresponding indications. In some cases, a spot (e.g., see spot_1, and spot_2) is substantially the same size as a subject electronic device or gate or node or area of interest. In other cases a spot might be larger than a subject electronic device or gate or node or area of interest. In other cases a spot might be smaller than a subject electronic device or gate or node or area of interest. Strictly as one example, a spot might be characterized as having a 240 nm diameter.

Figure 5A:
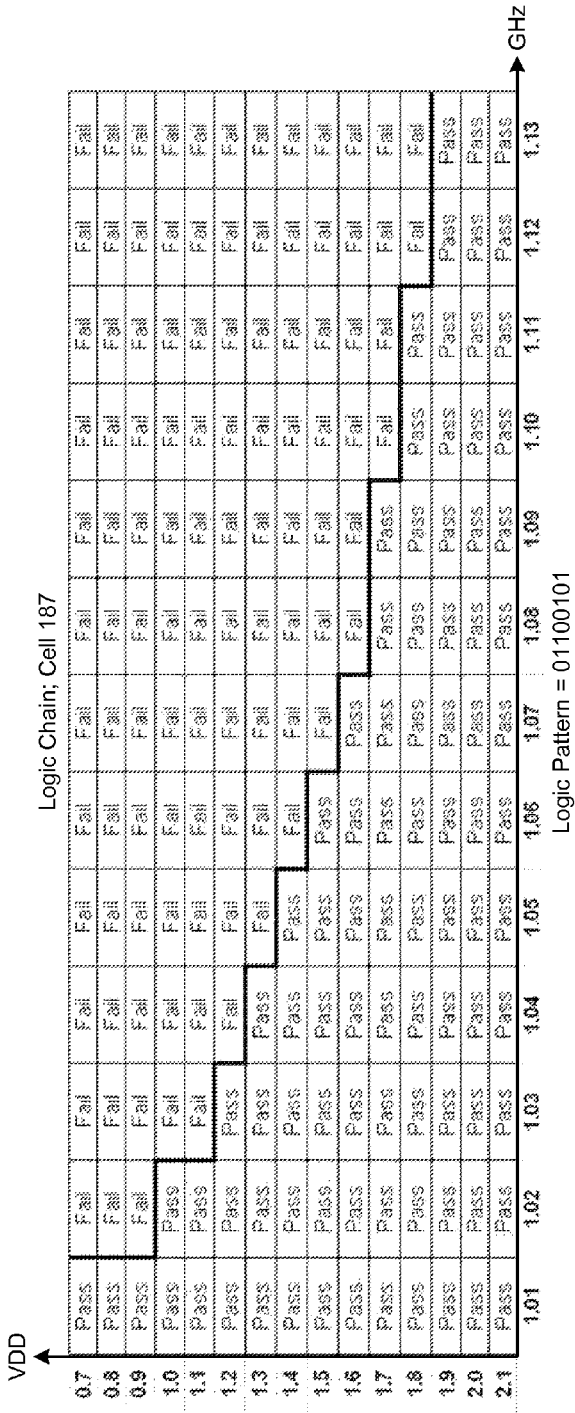
FIG. 5A is a Shmoo plot to determine failure causality as used within systems that implement at-speed integrated circuit device observation and analysis of a pre-selected set of sites for fast through-silicon in-circuit logic analysis, according to some embodiments.

FIG. 5A is a Shmoo plot 5A00 to determine failure causality as used within systems that implement at-speed integrated circuit device observation and analysis of a pre-selected set of sites for fast through-silicon in-circuit logic analysis.

In addition to the highlighted AOIs as discussed above, many other variations are possible for automatically displaying the logic state or logic pattern information. An additional example is a plot or graph showing the effects on logic patterns of varying factors such as frequency, temperature, and/or voltage.

A common description of IC performance is shown with Shmoo plots. Shmoo plots use IC pass/fail results when varying two or more operational parameters (e.g., frequency, temperature, and/or voltage). Changes in the logic pattern are observed while the operational parameters are varied. For example, the logic pattern at each cell in a scan chain may be plotted on a Shmoo plot while the frequency and voltage are varied.

FIG. 5A depicts a Shmoo plot with the pass/fail information from the first failed AOI (e.g., cell #187). In this case, the pass/fail results are plotted as the test frequency and applied voltages are varied. The objective of such a plot is to determine if the failure is more related to the applied voltage (VDD) or the operational speed (GHz).

Figure 5B:
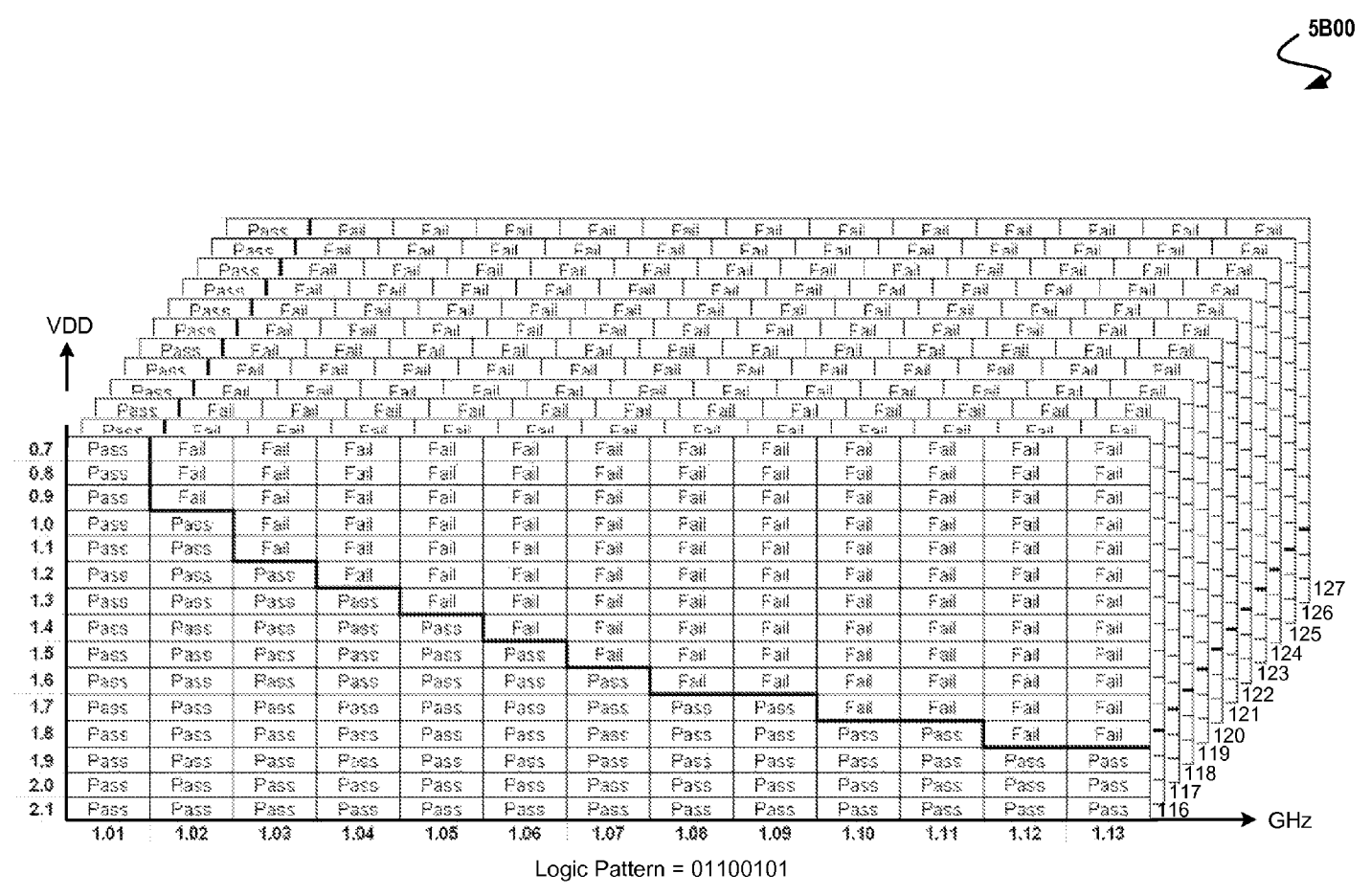

FIG. 5B shows a series of Shmoo plots 5B00 to determine failure causality as used within systems that implement at-speed integrated circuit device observation and analysis of a pre-selected set of sites for fast through-silicon in-circuit logic analysis. As an option, the present Shmoo plots 5B00 may be implemented in the context of the architecture and functionality of the embodiments described herein. Also, the Shmoo plots 5B00 or any aspect therein may be implemented in any desired environment.

The Shmoo plot of FIG. 5B shows the same pass/fail results as in FIG. 5A, however, in the case of FIG. 5B, the tests are performed on consecutive cells in another logic chain that has not failed. The underlying tests for this type of Shmoo plot "stresses" the cells to find a failure point related to voltage and/or frequency. Since the pass/fail of each cell is partially dependent on all previous cells, the likelihood of failures increase as the test is performed "deeper" in the sequence.

Figure 6:
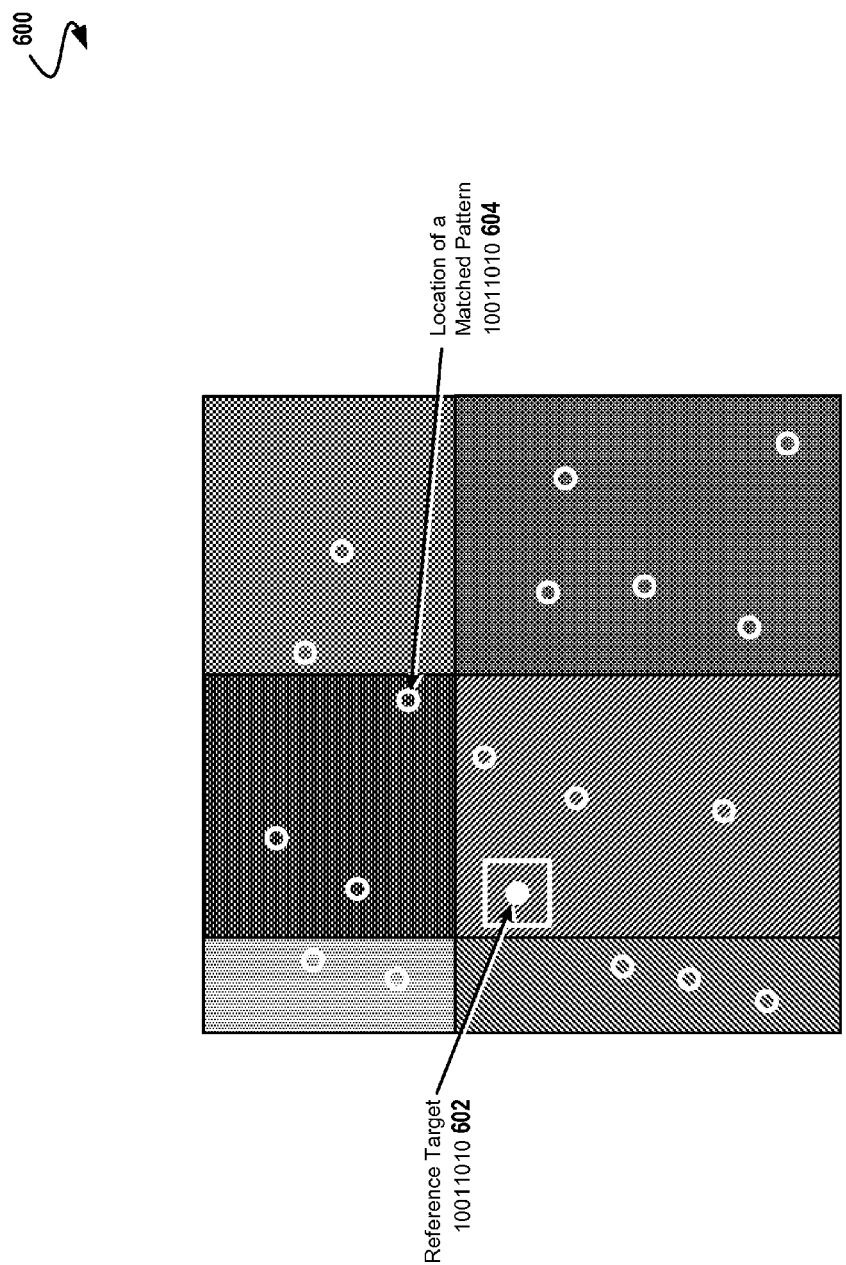
FIG. 6 shows highlighting imagery superimposed over a selected field of view of a portion of an integrated circuit under test in a system for at-speed integrated circuit device observation and analysis of a pre-selected set of sites for fast through-silicon in-circuit logic analysis, according to some embodiments.

FIG. 6 shows highlighting imagery superimposed over a selected field of view 600 of a portion of an integrated circuit under test in a system for at-speed integrated circuit device observation and analysis of a pre-selected set of sites for fast through-silicon in-circuit logic analysis. As an option, the present selected field of view 600 may be implemented in the context of the architecture and functionality of the embodiments described herein. Also, the selected field of view 600 or any aspect therein may be implemented in any desired environment.

FIG. 6 shows colored (or patterned) "dots" at locations where the logic comparator 150 has detected a pattern that matches the reference logic state or pattern 148. In this case, the reference logic pattern was detected at the location of the reference target. However, the reference logic pattern may also be provided by external test equipment, other software, or by the user. Strictly as an example, a user can input a known or suspected pattern, or a simulation run can be performed in order to provide the expected pattern.

In some cases the location of a reference target 602 might be proximally identical to the location where the reference pattern was observed. In other cases, some mis-registration might be present, and following the techniques as described herein, a location of a matched pattern 604 might be identified (e.g., using an optical microscope), and the imaging can be registered with precision. Such a location of a matched pattern 604 as identified can be considered to be merely a hypothesis, and additional readings might be taken to confirm and/or increase the statistical confidence that the location of a matched pattern 604 is indeed the reference target of interest.

Figure 7A:
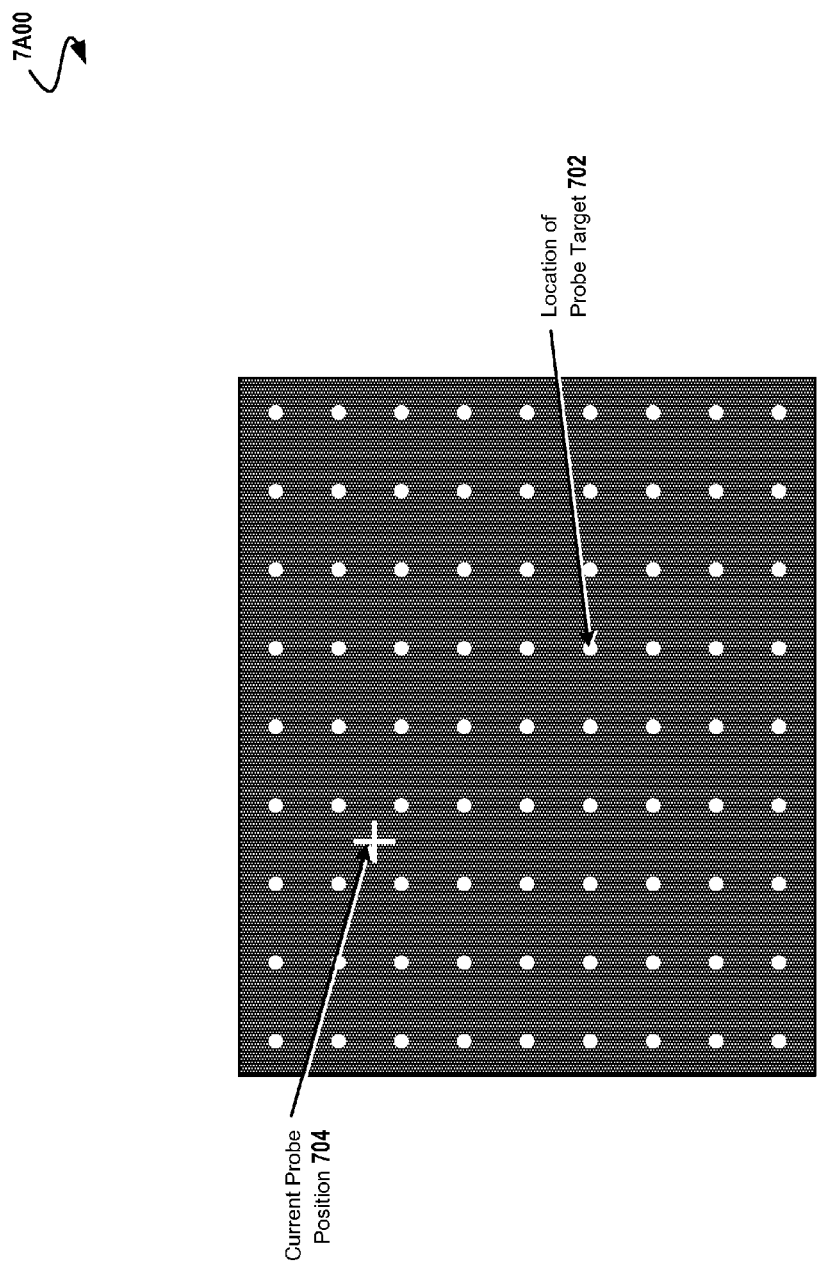
FIG. 7A shows a high magnification of a very small field of view used during misalignment detection for analyzing an integrated circuit under test in a system for at-speed integrated circuit device observation and analysis of a pre-selected set of sites for fast through-silicon in-circuit logic analysis, according to some embodiments.

In some cases the registration can be performed with extreme precision by taking optical measurements in a small area, thus producing an image to represent a high magnification of a very small field of view FIG. 7A shows a high magnification of a very small field of view 7A00 used during misalignment detection for analyzing an integrated circuit under test in a system for at-speed integrated circuit device observation and analysis of a pre-selected set of sites for fast through-silicon in-circuit logic analysis. As an option, the present very small field of view 7A00 may be implemented in the context of the architecture and functionality of the embodiments described herein. Also, the very small field of view 7A00 or any aspect therein may be implemented in any desired environment.

As described above, the current probe position 704 is misaligned with the actual location of the probe target 702. When very high magnification is used, there can be a mismatch between the location of the laser beam and the target location. This is due to offsets in the optical path and/or offsets in the mechanical stages used to position the laser beam. In some cases the laser beam is moved and an acquisition is re-attempted. Failure to acquire a signal leads to repeated re-positioning of the laser beam. In many cases, a reference frequency representative of the target signal is present, allowing acquisition of that reference frequency with an analog spectrum analyzer. Acquiring a signal and testing for the reference frequency at all pixels in a field of view spatially identifies the target and the operator calibrates the laser beam to that location. Following the herein-disclosed techniques, systems and methods, the target location may be detected directly using the pixel-by-pixel stepper to detect a target logic pattern instead of the frequency. The detected location is marked on the image with a superimposed symbol. Further, the above reference frequency at the target location may also be detected using fast Fourier transforms (FFTs) to locate the pixel with the strongest signal. In this case of locating the reference frequency with a FFT, the detected location is again marked on the image with a superimposed symbol and the operator calibrates the laser beam to that location. In still further embodiments, a search grid or user defined pattern can direct the laser to automatically step a pattern and record the waveform. The saved observations can be automatically collated, and a user can then inspect the results to check for cross talk and/or look for locations showing a maximum signal amplitude.

Figure 7B:
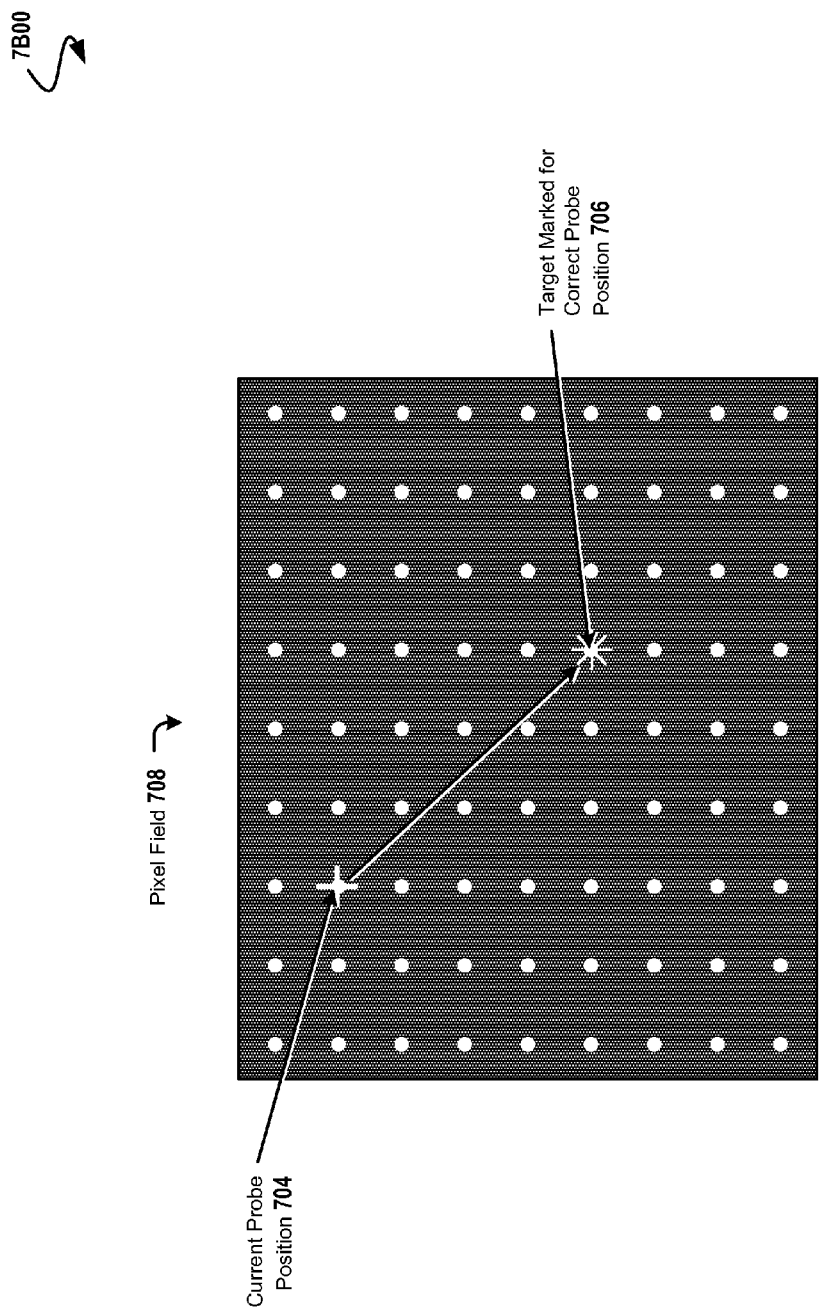
FIG. 7B shows a high magnification of a very small field of view used during alignment calibration for analyzing an integrated circuit under test in a system for at-speed integrated circuit device observation and analysis of a pre-selected set of sites for fast through-silicon in-circuit logic analysis, according to some embodiments.

FIG. 7B shows a high magnification of a very small field of view 7B00 used during alignment calibration for analyzing an integrated circuit under test in a system for at-speed integrated circuit device observation and analysis of a pre-selected set of sites for fast through-silicon in-circuit logic analysis. As an option, the present very small field of view 7B00 may be implemented in the context of the architecture and functionality of the embodiments described herein. Also, the pixel field 708 or any aspect therein may be implemented in any desired environment.

FIG. 7B shows the target marked showing the location of the target logic pattern or reference frequency. The current probe position 704 is calibrated to match the correct probe position 706. A test pattern can be placed into a chuck, and thereby calibrate the XY-addressability of the laser probe. In some situations, and augmenting the previous discussion of FIG. 1E, some implementations perform a 'global' three-point or N-point alignment within the FOV, and selects a target or targets to match to a layout. Such precision alignment/registration can be imaged (e.g., via graphical superimposition on display surfaces 129) to facilitate further precise optical inspection.

Figure 8A:
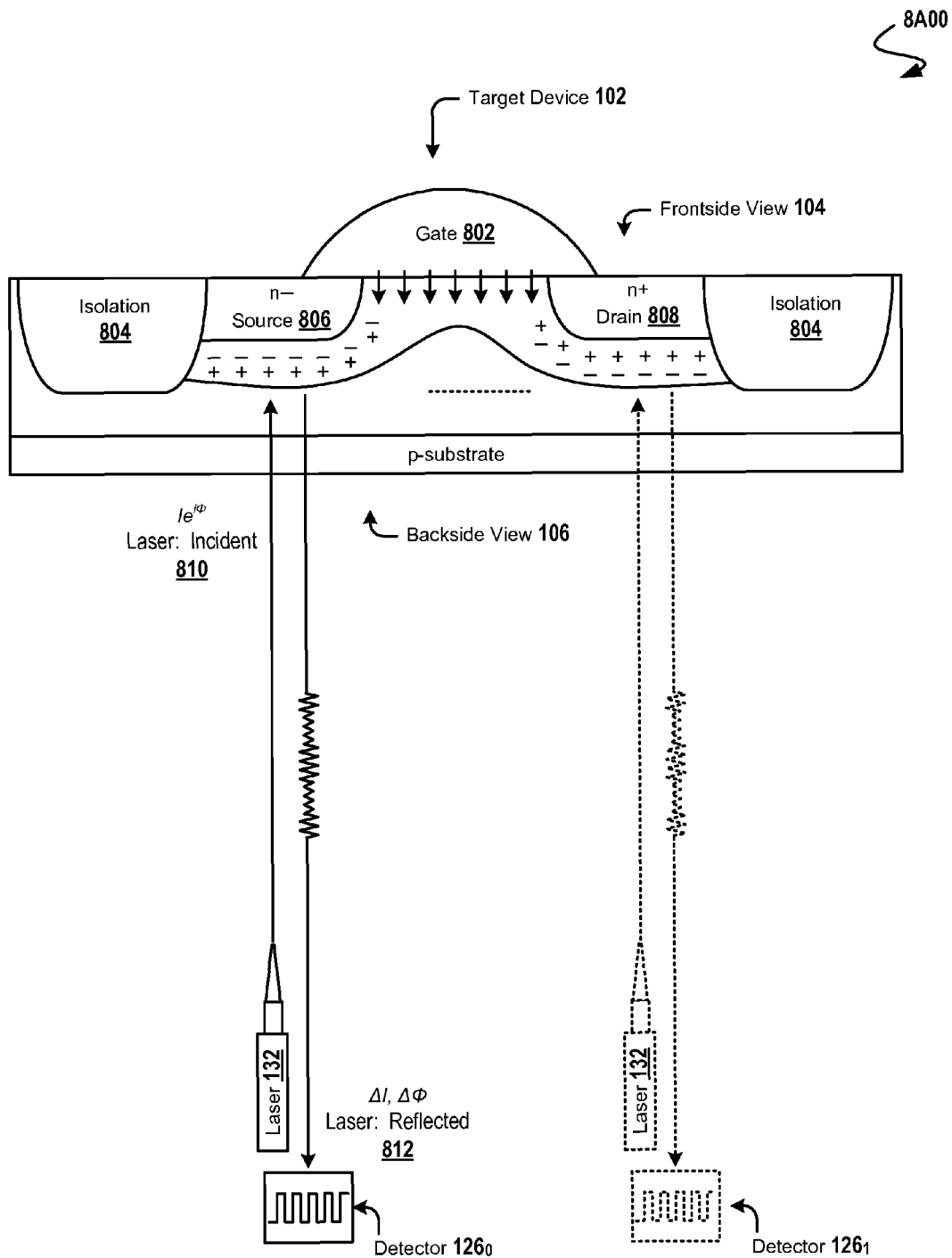
FIG. 8A is a schematic of a stepped optical microscope as used in systems implementing at-speed integrated circuit device observation and analysis of a pre-selected set of sites for fast through-silicon in-circuit logic analysis, according to some embodiments.

FIG. 8A is a schematic 8A00 of a stepped optical microscope as used in systems implementing at-speed integrated circuit device observation and analysis of a pre-selected set of sites for fast through-silicon in-circuit logic analysis. As an option, the present schematic 8A00 may be implemented in the context of the architecture and functionality of the embodiments described herein. Also, the schematic 8A00 or any aspect therein may be implemented in any desired environment.

As shown, a target device 102 is affixed to a stage, and the stage can be moved in the X and Y directions within the XY plane. Or, a target device 102 is affixed to a stage, and the laser 132 and detector 126 can be moved in the X and Y directions within the XY plane.

As depicted in the apparatus of FIG. 8A, free carriers modulated by the target device 102 serve to modify the absorption and index of refraction of the materials. As is well known in optics, this modifies the reflectivity and intensity of the return 812 in the form of reflected light from incident laser 810. A change or modulation detected in reflected light 812, or a change in intensity corresponds to the device behavior as the transistor switches on and off A fast detector 126 is used to measure the return laser power signal over a time period. As shown, free carriers can accumulate in areas such as near or between a transistor source 806 and a gate 802, or between a transistor gate and a drain 808, or between an isolation barrier 804 and any other component of any other electronic structure or device.

Figure 8B:
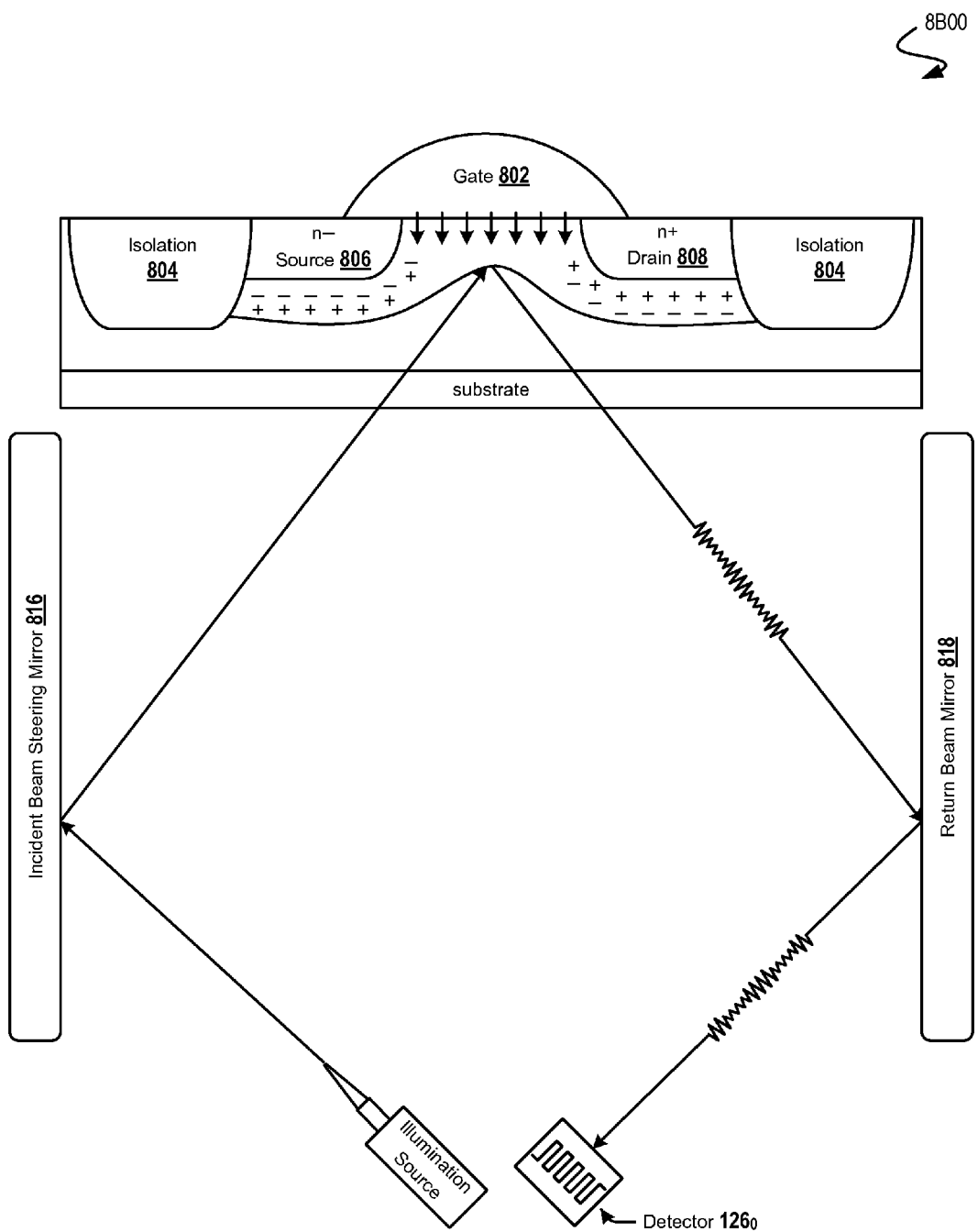
FIG. 8B is a schematic of a steered-beam optical microscope as used in systems implementing at-speed integrated circuit device observation and analysis of a pre-selected set of sites for fast through-silicon in-circuit logic analysis, according to some embodiments.

FIG. 8B is a schematic 8B00 of a steered beam optical microscope as used in systems implementing at-speed integrated circuit device observation and analysis of a pre-selected set of sites for fast through-silicon in-circuit logic analysis. As an option, the present schematic 8B00 may be implemented in the context of the architecture and functionality of the embodiments described herein. Also, the schematic 8B00 or any aspect therein may be implemented in any desired environment.

The apparatus corresponding to schematic 8B00 comprises an illumination device, a detector 126, an incident beam steering mirror 816, and return beam mirror 818. The incident beam steering mirror 816 can be tipped/rotated so as to steer the incident laser beam to any location on the backside of the target device 102. Similarly, the return beam mirror 818 can be tipped/rotated so as to steer the return beam to the detector.

FIG. 9 is a schematic depicting a node isolation technique 900 using a sequence of observations from a stepped optical microscope as used in systems for at-speed integrated circuit device observation and analysis of a pre-selected set of sites for fast through-silicon in-circuit logic analysis. As an option, the present node isolation technique 900 may be implemented in the context of the architecture and functionality of the embodiments described herein. Also, the node isolation technique 900 or any aspect therein may be implemented in any desired environment.

The report 902 shows a series of measurements (e.g., failure analysis measurements) pertaining to vias. Of interest is the location (and its corresponding electronic device) that is measured to be 'open'. An optical microscope might be used to take measurements at and/or around a group of candidate vias and report the readings. Accordingly, one or more of the candidate vias can be identified as being the source of the 'open'. Still further analysis can be performed so as to unequivocally determine the existence of the open at the candidate position/device. For example, a simulation test vector known to produce a value at or near the candidate via can be applied to the device under test, and further through-device in-circuit measurements 904 may be taken.

Figure 10:
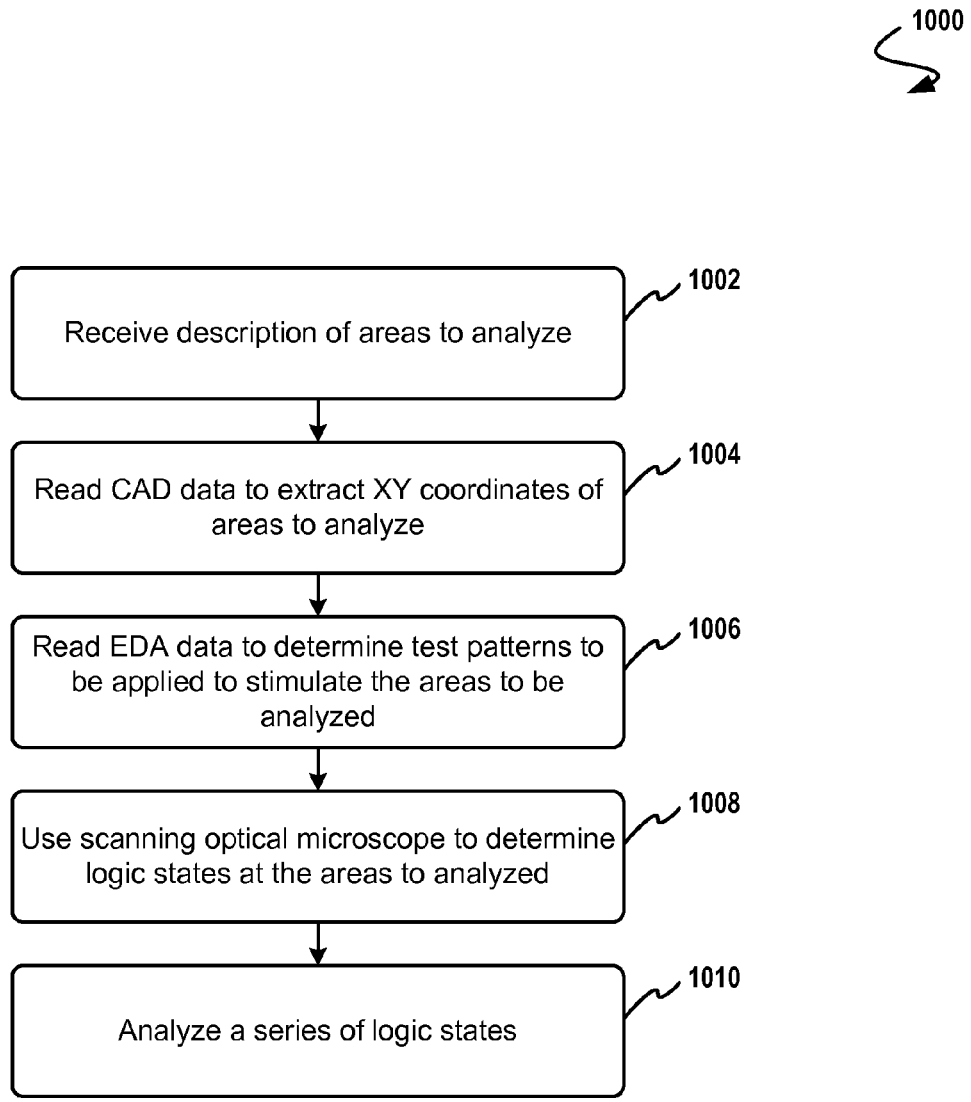
FIG. 10 is a flow chart of a technique for using CAD and EDA (Electronic Design Automation) data to determine candidate sites as used in systems for at-speed integrated circuit device observation and analysis of a pre-selected set of sites for fast through-silicon in-circuit logic analysis, according to some embodiments.

FIG. 10 is a flow chart 1000 of a technique for using CAD and EDA data to determine candidate sites as used in systems for at-speed integrated circuit device observation and analysis of a pre-selected set of sites for fast through-silicon in-circuit logic analysis. As an option, the present flow chart 1000 may be implemented in the context of the architecture and functionality of the embodiments described herein. Also, the flow chart 1000 or any aspect therein may be implemented in any desired environment.

Using the herein disclosed apparatus and techniques, a particular test or series of tests for logic values and/or changing logic values and/or timing information can be performed at the will of an operator. For example, and as shown, an operator or software program can receive a description of areas to analyze (see operation 1002). Such a description can come in various forms, including a schematic or HDL (Hardware Description Language) description of a scan chain, or as a description of an I/O ring, etc. Next, steps serve to read the CAD data (see operation 1004) to extract XY location coordinates of the area or areas of interest. In some cases, a specified area of interest may be de-composed into multiple sub-areas. Next, EDA data is read to determine test patterns (if any) to be applied to stimulate the areas of interest (see operation 1006). An optical microscope (e.g., scanning optical microscope, stepping optical microscope) is used to probe for logic states and/or changing logic states and/or timing information at various areas of interest (see operation 1008). Given the results of the probe (e.g., extracted logic states), then the extracted logic states can be compared to expected values (see operation 1010). Matches or mismatches can be displayed on a display surface.

In some embodiments, a software module might be employed in order to provide fast spatial search algorithm or patterns. For example, a pattern match algorithm (e.g., a binary search, a "golden rule", a Fibonacci progression, or any other algorithm) can serve to determine a "match" and/or a location of a match.

Figure 11:
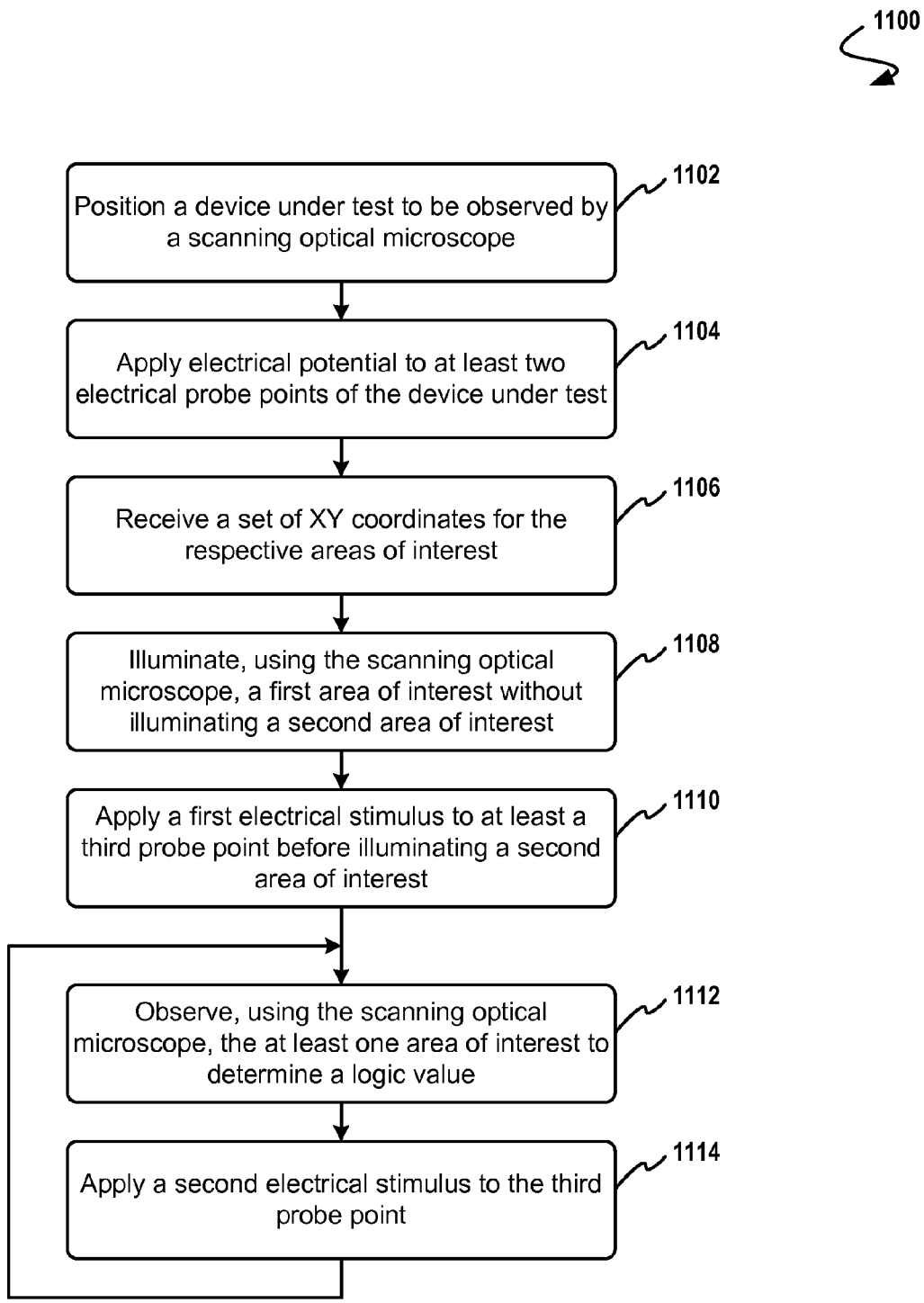
FIG. 11 is a system for at-speed integrated circuit device observation and analysis of a pre-selected set of sites for fast through-silicon in-circuit logic analysis, according to some embodiments.

FIG. 11 is a system for at-speed integrated circuit device observation and analysis of a pre-selected set of sites for fast through-silicon in-circuit logic analysis.

As shown, the system 1100 carries out steps to:
Position a device under test to be observed by a scanning optical microscope (see step 1102).
Apply electrical potential to at least two electrical probe points of the device under test (see step 1104).
Receive a set of XY coordinates for the respective areas of interest (see step 1106).
Illuminate, using the scanning optical microscope, a first area of interest without illuminating a second area of interest (see step 1108).
Apply a first electrical stimulus to at least a third probe point before illuminating a second area of interest (see step 1110).
Observe, using the scanning optical microscope, the at least one area of interest to determine a logic value (see step 1112).
Apply a second electrical stimulus to the third probe point (see step 1114).

Figure 12:
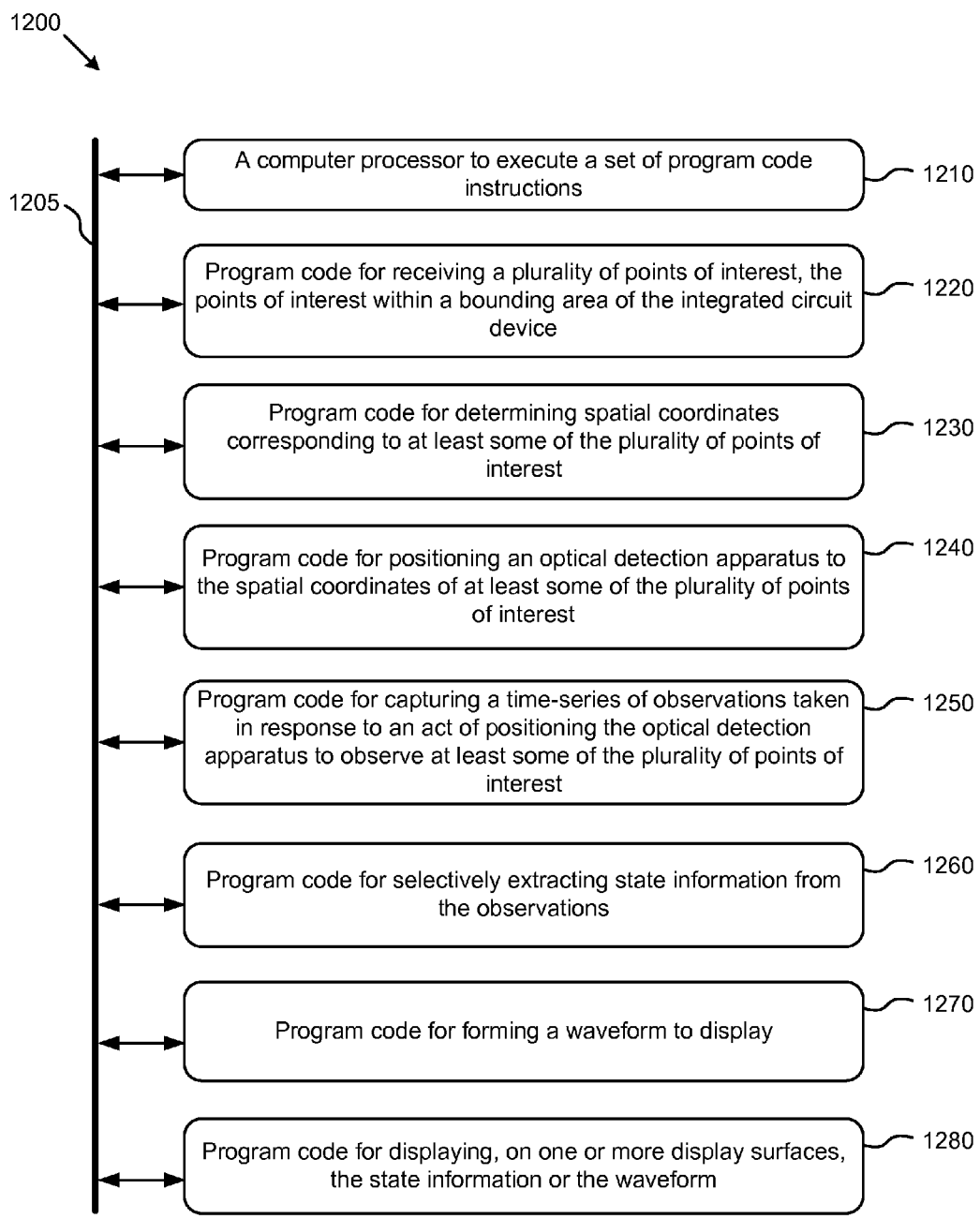
FIG. 12 depicts a block diagram of a system for at-speed integrated circuit device observation and analysis of a pre-selected set of sites for fast through-silicon in-circuit logic analysis, according to some embodiments.

FIG. 12 depicts a block diagram of a system for at-speed integrated circuit device observation of analysis of a pre-selected set of sites for fast through-silicon in-circuit logic analysis. As an option, the present system 1200 may be implemented in the context of the architecture and functionality of the embodiments described herein. Of course, however, the system 1200 or any operation therein may be carried out in any desired environment.

As shown, system 1200 comprises at least one processor and at least one memory, the memory serving to store program instructions corresponding to the operations of the system. As shown, an operation can be implemented in whole or in part using program instructions accessible by a module. The modules are connected to a communication path 1205, and any operation can communicate with any other operations over communication path 1205. The modules of the system can, individually or in combination, perform method operations within system 1200. Any operations performed within system 1200 may be performed in any order unless as may be specified in the claims. The embodiment of FIG. 12 implements a portion of a computer system, shown as system 1200, comprising a computer processor to execute a set of program code instructions (see module 1210) and modules for accessing memory to hold program code instructions to perform: receiving a plurality of points of interest, the points of interest within a bounding area of the integrated circuit device (see module 1220); determining spatial coordinates corresponding to at least some of the plurality of points of interest (see module 1230); positioning an optical detection apparatus to the spatial coordinates of at least some of the plurality of points of interest (see module 1240); capturing a time-series of observations taken in response to an act of positioning the optical detection apparatus to observe at least some of the plurality of points of interest (see module 1250); selectively extracting state information from the observations (see module 1260); forming a waveform to display (see module 1270); and displaying, on one or more display surfaces, the state information or the waveform (see module 1280).

The system 1200 can be configured such that the spatial coordinates are determined using CAD data. Moreover, in exemplary embodiments, successive spatial coordinates are not adjacent, and in some cases the spatial coordinates are determined using user-supplied data.

The system 1200 can employ illumination and positioning devices such that positioning the optical detection apparatus comprises a mirror, or the integrated circuit device is affixed into a chuck on an XY stage, and the integrated circuit can be moved with the stage into position.

Figure 13:
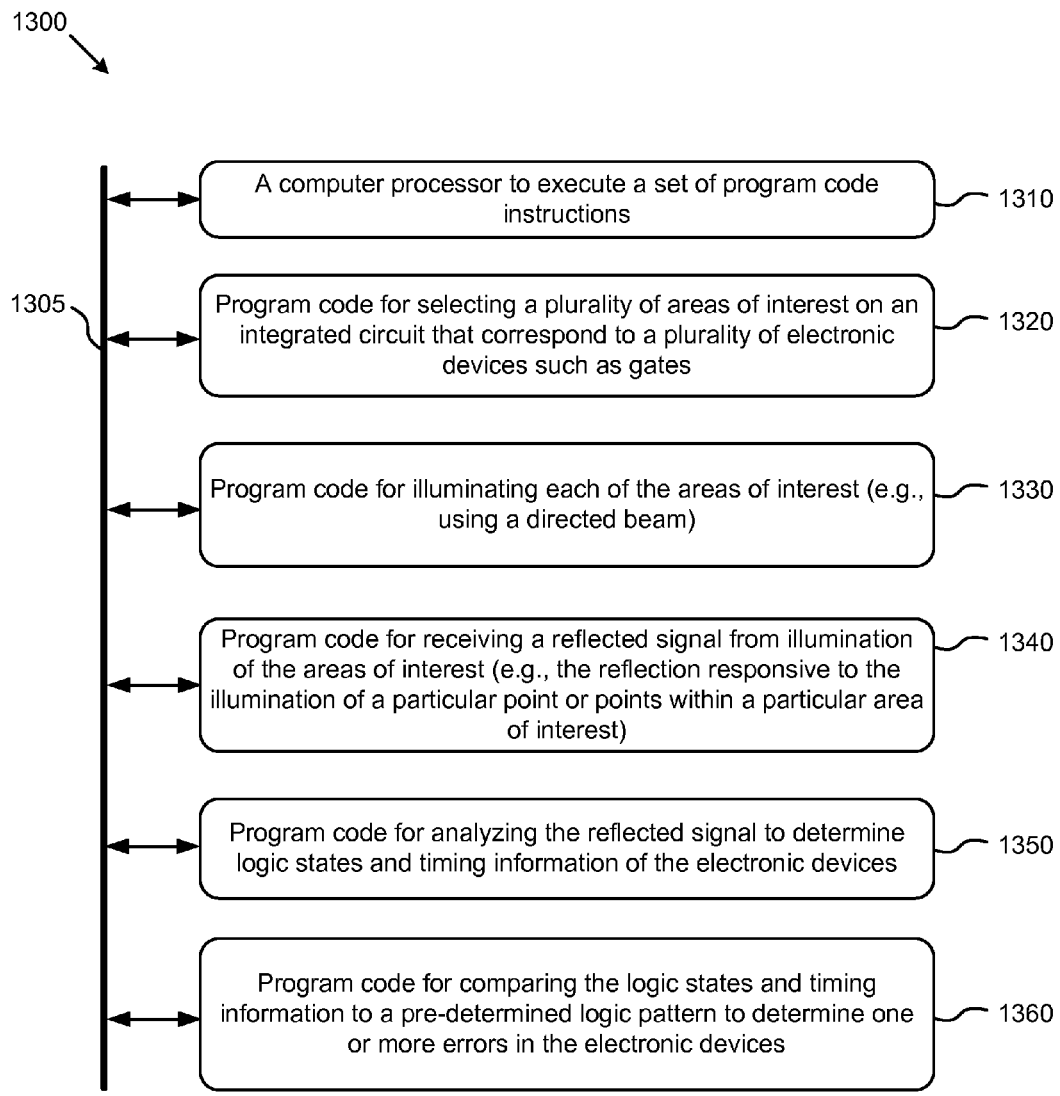
FIG. 13 is a system for at-speed integrated circuit device observation and analysis of a pre-selected set of sites for fast through-silicon in-circuit logic analysis, according to some embodiments.

FIG. 13 is a system for at-speed integrated circuit device observation and analysis of a pre-selected set of sites for fast through-silicon in-circuit logic analysis, according to some embodiments. As an option, the present system 1300 may be implemented in the context of the architecture and functionality of the embodiments described herein. Of course, however, the system 1300 or any operation therein may be carried out in any desired environment.

As shown, system 1300 comprises at least one processor and at least one memory, the memory serving to store program instructions corresponding to the operations of the system. As shown, an operation can be implemented in whole or in part using program instructions accessible by a module. The modules are connected to a communication path 1305, and any operation can communicate with any other operations over communication path 1305. The modules of the system can, individually or in combination, perform method operations within system 1300. Any operations performed within system 1300 may be performed in any order unless as may be specified in the claims. The embodiment of FIG. 13 implements a portion of a computer system, shown as system 1300, comprising a computer processor to execute a set of program code instructions (see module 1310) and modules for accessing memory to hold program code instructions to perform: selecting a plurality of areas of interest on an integrated circuit that correspond to a plurality of electronic devices such as gates (see module 1320); illuminating (e.g., using a laser beam) each of the areas of interest (see module 1330); receiving a reflected signal from illumination of the areas of interest such as the reflection responsive to the illumination of a particular point or points within a particular area of interest (see module 1340); and analyzing the reflected signal to determine logic states and timing information of the electronic devices (see module 1350). Further, some embodiments include a processor for comparing the logic states and timing information to a pre-determined logic pattern to determine one or more errors in the electronic devices (see module 1360).

Additional Embodiments of the Disclosure

Continuous Acquisition

Returning to the discussion of FIG. 1B, some embodiments include a high-speed digitizer with low latency providing very long strings of samples allowing statistical re-construction of logic states and timing in short periods of time. The high-speed digitizer can acquire and sum data continuously without interruption. Acquisitions (even up to millions of acquisitions) are acquired in real-time and accumulated in a summing buffer. A dual-banked memory buffer allows acquisition steps and communication steps to occur simultaneously without interruption and to "dump" the data to an outboard processor, thus without incurring any "dead time".

Dynamic Laser Stimulation

Certain pass/fail techniques like LADA and SDL can be performed based on direct responses from an internal logic node using the extracted pattern match. Heating pulses or photocurrent stimulation can be applied by a laser to stimulate a timing response in the IC. The response can be measured as "pass/fail" as it compares with respect to changes from the I/O pin or other AOI with an ATE. With pattern matching, parameters such as laser power, voltage, frequency, and temperature can be varied to measure changes in the pass/fail directly on the internal logic that was extracted in real time where the laser was pointed within the IC. Such a technique can be used to improve sensitivity (e.g., since the logic does not have to propagate out of the IC to an I/O pin in order to determine if there was a state change).

Analytical Techniques

It is possible to use pattern recognition algorithms to align AOIs with logic cells to automatically determine offsets. Software and/or hardware can be employed to implement effective and/or optimal search algorithms and/or patterns in order to determine logic states and/or timing. In some cases a search algorithm can be used to determine where (e.g., timing-wise) a particular logic cycle starts. Determinations can be reported in absolute time or with respect to a phase reference.

Still further, algorithms can be used to integrate or average measurements within the AOI or sub-AOI. This averaging can be brought to the proximity of individual pixels or bin measurements within the AOI or SAOIs, and can be integrated or averaged together to improve SNR.

Measurements to Determine Spatial Mapping of Phase Information

Measured and/or analytically-determined phase shift magnitude can be spatially mapped onto the image and/or layout of an IC. Algorithms and display techniques can pass logical patterns to external tools which in turn can postulate candidate matches of acquired patterns to predicted patterns. For example, measured logic patterns can be linked to external tools (e.g., ATE) and databases (e.g., EDA) for comparison of measured and predicted logic. The information can also be fed back into EDA simulator tools to improve predictions of faults.

Searching Using Patterns

A user definable pattern search can be used to position the laser to a series of positions corresponding to pixel-of-interest to next pixel-of-interest (e.g., non-sequential pixels) and record waveforms automatically as measured at each pixel-of-interest. The user can further inspect the waveforms to determine which pixels had cross talk and where signal maximums exist. For example, using a user definable pattern search, an algorithm might position the laser at the center of the expected location of a particular signal carrier, then move in a 2×2 pixel pattern to record waveforms. The search can be expanded unless and until it is stopped. The grid might expand to capture the outer 3×3 elements of the grid, then outer 4×4 elements . . . 5×5 . . . and so on. The user can inspect the waveforms as they are collected to determine if enough data is available to make a decision. For instance, the user can also apply use-defined signal processing on the waveforms as they are gathered to assist in decision processes.

Binning Searches for Clustered Signal Areas

A search algorithm can search (e.g., in real time) for "cluster" areas that are promising as for matching to known-true signals. Once cluster areas are determined, further signal averages with higher pixel density can be performed in just a few specific areas of interest. This technique can be contrasted with various LADA techniques that can take over 8 hours for repeated averaging. Techniques involving binning searches for clustered signal areas also applicable to advance over FM.

Pseudo-Random Patterning

Random or pseudo-random patterning can be used to eliminate tail artifacts that are sometimes present in sequential scanning Random or pseudo-random patterning can also help to reduce or eliminate laser damage. As can be understood by those skilled in the art, by decreasing effective dwell time in an area, the temperature change in an area can be managed. Elapsed time between dwells serves to dissipate unwanted heat and/or dump unwanted charge.

Any one or more of the aforementioned techniques can be combined. Strictly as examples, a method or system can include operations to perform:

Cross referencing logic cell chains or cones and correlate the cells to determine a passing or failing status.

Sampling Boolean logic and filtering or ageraging such as by using thresholding techniques, and/or box car averaging, and/or edge enhancements etc.

Calculating a minimum number of samples to determine a passing state within a statistical likelihood.

Autocorrelation analysis in order to determine probability of a match to the pre-determined logic pattern.

System Architecture Overview

FIG. 14 is a block diagram 1400 of a computer system for implementing embodiments of this disclosure. In one context, The computer system includes nodes for client computer systems (e.g., client system $1402_1$ through client system $1402_N$), nodes for server computer systems (e.g., server system $1404_1$ through server system $1404_N$), and nodes for network infrastructure (e.g., network infrastructure $1406_1$ through network infrastructure $1406_N$), any of which nodes may comprise a machine (e.g., computer 1450) within which a set of instructions for causing the machine to perform any one of the techniques discussed above may be executed. The embodiment shown is purely exemplary, and might be implemented in the context of one or more of the figures herein.

Any node of the network may comprise a general-purpose processor, a digital signal processor (DSP), an application specific integrated circuit (ASIC), a field programmable gate array (FPGA) or other programmable logic device, a discrete gate or transistor logic, discrete hardware components, or any combination thereof capable to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration, etc.).

In alternative embodiments, a node may comprise a machine in the form of a virtual machine (VM), a virtual server, a virtual client, a virtual desktop, a virtual volume, a network router, a network switch, a network bridge, a personal digital assistant (PDA), a cellular telephone, a web appliance, or any machine capable of executing a sequence of instructions that specify actions to be taken by that machine. Any node of the network may communicate cooperatively with another node on the network. In some embodiments, any node of the network may communicate cooperatively with every other node of the network. Further, any node or group of nodes on the network may comprise one or more computer systems (e.g., a client computer system, a server computer system) and/or may comprise one or more embedded computer systems (including a processor and memory), a massively parallel computer system, and/or a cloud computer system.

The computer system (e.g., computer 1450) includes a processor 1408 (e.g., a processor core, a microprocessor, a computing device, etc.), a computer memory (e.g., main memory 1410), and/or a static memory 1412, which communicate with each other via a system bus 1414. The computer 1450 may further include a display unit (e.g., computer display 1416) that may comprise a touch screen, or a liquid crystal display (LCD), or a light emitting diode (LED) display, or a cathode ray tube (CRT). As shown, the computer system also includes a human input/output (I/O) device 1418 (e.g., a keyboard, an alphanumeric keypad, etc.), a pointing device 1420 (e.g., a mouse, a touch screen, etc.), a drive unit 1422 (e.g., a disk drive unit, a CD/DVD drive, a tangible computer readable removable media drive, an SSD storage device, etc.), a signal generation device 1428 (e.g., a speaker, an audio output, etc.), and a network interface device 1430 (e.g., an Ethernet interface, a wired network interface, a wireless network interface, a propagated signal interface, etc.).

The drive unit 1422 includes a machine-readable medium 1424 on which is stored a set of instructions (e.g., software, firmware, middleware, etc.) 1426 embodying any one, or all, of the methodologies described above. The set of instructions 1426 is also shown to reside, completely or at least partially, within the main memory and/or within the processor 1408. The set of instructions 1426 may further be transmitted or received via the network interface device 1430 over the system bus 1414.

It is to be understood that embodiments of this disclosure may be used as, or to support, a set of instructions executed upon some form of processing core (such as the CPU of a computer) or otherwise implemented or realized upon or within a machine- or computer-readable medium. A machine-readable medium includes any mechanism for storing non-transitory information in a form readable by a machine (e.g., a computer). For example, a machine-readable medium includes read-only memory (ROM); random access memory (RAM); magnetic disk storage media; optical storage media; flash memory devices; and electrical, optical or acoustical or any other type of media suitable for storing non-transitory information.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than restrictive sense.

What is claimed is:

1. A method for testing an integrated circuit, the method comprising:
   selecting a plurality of areas of interest on the integrated circuit that correspond to a plurality of electronic devices of the integrated circuit;
   illuminating each of the areas of interest over a plurality of cycles;
   receiving a reflected signal from the illuminated areas of interest, wherein the reflected signal is modulated by at least one of voltage and current present within at least one of the electronic devices;
   converting the received reflected signal into an electrical signal;
   analyzing the electric signal to determine a bit pattern and timing information for one or more of the electronic devices; and
   comparing the bit patterns and timing information to a pre-determined bit pattern for the one or more electronic devices to determine one or more errors in one or more of the electronic devices.

2. The method of claim 1, further comprising;
   comparing the bit pattern and timing information to a pre-determined logic pattern to determine one or more errors in the electronic devices.

3. The method of claim 1, wherein the areas of interest are determined using CAD data that define scan boundaries for the instrument.

4. The method of claim 1, wherein successive areas of interest are not adjacent.

5. The method of claim 1, wherein the areas of interest are determined using user-supplied data.

6. The method of claim 1, wherein illuminating each of the areas of interest comprises positioning an XY stage.

7. The method of claim 1, further comprising:
   successively illuminating and analyzing to determine a time-based logic pattern for one or more of the electronic devices.

8. The method of claim 7, further comprising displaying, using one or more display surfaces, the time-based logic pattern.

9. A system for testing an integrated circuit, comprising:
   a laser for illuminating a plurality of areas of interest on the integrated circuit, wherein each of the areas of interest correspond to an electronic device of the integrated circuit;
   a photodetector for receiving a reflected signal from the illuminated areas of interest and converting the received reflected signal into an electrical signal; and
   a processor, the processor being adapted to execute a set of program code instructions, which when executed cause the processor to:
   analyze the electric signal to determine a bit pattern and timing information for one or more of the electronic devices; and
   compare the bit patterns and timing information to a pre-determined bit pattern for the one or more electronic devices to determine one or more errors in one or more of the electronic devices.

10. The system of claim 9, wherein the areas of interest are determined using CAD data that define scan boundaries for the instrument.

11. The system of claim 9, wherein successive areas of interest are not adjacent.

12. The system of claim 9, wherein the areas of interest are determined using user-supplied data.

13. The system of claim 9, further comprising:
    an XY stage for positioning the integrated circuit so that the areas of interest may be illuminated by the laser.

14. The system of claim 9, wherein the processor is further configured to determine a time-based logic pattern for one or more of the electronic devices.

15. The system of claim 14, wherein the processor is further configured to provide a display of the time-based logic pattern.

16. A computer program product embodied in a non-transitory computer readable medium, the computer readable medium having stored thereon a sequence of instructions which, when executed by a processor causes the processor to execute a process for testing an integrated circuit, the process comprising:

selecting a plurality of areas of interest on the integrated circuit that correspond to a plurality of electronic devices of the integrated circuit;

illuminating each of the areas of interest over a plurality of cycles;

receiving a reflected signal from the illuminated areas of interest, wherein the reflected signal is modulated by at least one of voltage and current present within at least one of the electronic devices;

converting the received reflected signal into an electrical signal;

analyzing the electric signal to determine a bit pattern and timing information for one or more of the electronic devices; and comparing the bit patterns and timing information to a pre-determined bit pattern for the one or more electronic devices to determine one or more errors in one or more of the electronic devices.

17. The computer program product of claim 16, wherein the sequence of instructions further causes the processor to execute a process comprising:

determining a probability of a match of a bit pattern for an electronic device of the one or more electronic devices to the pre-determined logic pattern for the electronic device.

18. The computer program product of claim 16, wherein the areas of interest are determined using CAD data that define scan boundaries for the instrument.

19. The computer program product of claim 16, wherein the areas of interest are determined using user-supplied data.

20. The computer program product of claim 16, wherein successive areas of interest are not adjacent.

21. The computer program product of claim 16, wherein the sequence of instructions further cause the processor to execute a process comprising:

determining a time-based logic pattern.

22. The computer program product of claim 16, wherein the sequence of instructions further cause the processor to execute a process comprising:

determining at least one of a Schmoo plot and a graphical representation of selective test parameters.

23. The computer program product of claim 16, wherein the sequence of instructions further cause the processor to execute a process comprising;

cross referencing at least one of a logic cell chains or cones to correlate as passing or failing.

24. The computer program product of claim 16, wherein the sequence of instructions further cause the processor to execute a process comprising:

sampling Boolean logic for at least one of thresholding, box car averaging, and edge enhancement.

25. The computer program product of claim 16, wherein the sequence of instructions further cause the processor to execute a process comprising:

calculating a minimum number of areas of interest for determining a passing state for the integrated circuit.

26. A method for testing an integrated circuit, the method comprising:

selecting a plurality of areas of interest on an integrated circuit, each of the areas of interest corresponding to an electronic devices of the integrated circuit;

illuminating each of the areas of interest;

receiving a reflected signal from illumination of the areas of interest; reflected signal is modulated by voltage or current in internal device of the integrated circuit;

detecting illumination with a photodetector and converting into an electrical signal digitizing the electrical signal with a high acquisition speed digitizer.

27. The method of claim 26, wherein the high acquisition speed digitizer is configured to capture available loop trigger events, the method further comprising:

converting modulation into waveforms.

28. The method of claim 27, further converting waveforms from claim 27 into a bit pattern for comparison with a pre-determined bit pattern.

* * * * *